US010468507B2

(12) United States Patent
Tal et al.

(10) Patent No.: US 10,468,507 B2
(45) Date of Patent: Nov. 5, 2019

(54) NANOSCALE ELECTRONIC SPIN FILTER

(71) Applicant: YEDA RESEARCH AND DEVELOPMENT CO. LTD., Rehovot (IL)

(72) Inventors: Oren Tal, Rehovot (IL); Ran Vardimon, Rehovot (IL); Marina Klionsky, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 0 days.

(21) Appl. No.: 15/527,711

(22) PCT Filed: Nov. 19, 2015

(86) PCT No.: PCT/IL2015/051115
§ 371 (c)(1),
(2) Date: May 18, 2017

(87) PCT Pub. No.: WO2016/079741
PCT Pub. Date: May 26, 2016

(65) Prior Publication Data
US 2018/0019328 A1 Jan. 18, 2018

Related U.S. Application Data

(60) Provisional application No. 62/081,654, filed on Nov. 19, 2014.

(51) Int. Cl.
*H01L 29/66* (2006.01)
*B82Y 25/00* (2011.01)
(Continued)

(52) U.S. Cl.
CPC ........ *H01L 29/66984* (2013.01); *B82Y 10/00* (2013.01); *B82Y 25/00* (2013.01);
(Continued)

(58) Field of Classification Search
CPC ......... H01L 29/66984; H01L 28/40–92; H01L 29/7408; H01L 2924/1205; H01L 2924/19041; H01L 27/0288; H01L 27/0629; H01L 27/0635; H01L 27/0647–0652; H01L 27/067–0682; H01L 27/0711–0733; H01L 27/075–0755; H01L 27/0777;
(Continued)

(56) References Cited

U.S. PATENT DOCUMENTS 5,612,082 A * 3/1997 Azuma ............. C23C 16/45561
438/393
2015/0129994 A1 5/2015 Bowen et al.

OTHER PUBLICATIONS

Beckerle, John David "Dynamics of molecular adsorption: I—collision induced dissociative chemisorption and desorption of CH4ON Ni (111), II—adsorption of CO and O2ON Ni (111) at 8 K" Diss. Massachusetts Institute of Technology, 1988.
(Continued)

*Primary Examiner* — Tucker J Wright
(74) *Attorney, Agent, or Firm* — Mark S. Cohen; Pearl Cohen Zedek Latzer Baratz LLP

(57) ABSTRACT

The present invention is in the field of spintronics, and relates to a highly efficient spin filter device, such as a spin-polarizer or a spin valve, and a method for fabrication thereof.

24 Claims, 8 Drawing Sheets

(51) Int. Cl.
- H01F 1/00 (2006.01)
- B82Y 10/00 (2011.01)
- H01L 29/76 (2006.01)
- H01L 29/84 (2006.01)
- H01L 29/06 (2006.01)
- H01F 10/32 (2006.01)
- H01L 29/82 (2006.01)

(52) U.S. Cl.
CPC ......... *H01F 1/0072* (2013.01); *H01F 10/329* (2013.01); *H01F 10/3254* (2013.01); *H01L 29/0673* (2013.01); *H01L 29/66007* (2013.01); *H01L 29/7613* (2013.01); *H01L 29/82* (2013.01); *H01L 29/84* (2013.01)

(58) Field of Classification Search
CPC .... H01L 27/0783–0794; H01L 27/0805–0811; H01L 27/101; H01L 2027/11842; G11B 5/306; G11B 5/3909; G11B 2005/3996; H01G 4/00–40; H01G 9/00–28
See application file for complete search history.

(56) References Cited

OTHER PUBLICATIONS

Bolotin, et al. "From ballistic transport to tunneling in electromigrated ferromagnetic breakjunctions" Nano letters 6.1 (2006): 123-127.
Brede, et al. "Spin-and energy-dependent tunneling through a single molecule with intramolecular spatial resolution" Physical review letters 105.4 (2010): 047204.
Brune, et al. "Spin polarization of the quantum spin Hall edge states" Nature Physics 8.6 (2012): 485.
Folk, et al. "A gate-controlled bidirectional spin lifter using quantum coherence" Science 299.5607 (2003): 679-682.
Hsu et al. "Adsorption of N2, CO and O2 on Ni (110) at 20 K." *Surface Science* 117.1-3 (1982): 581-589.
International Search Report for PCT Application No. PCTIL2015051115 dated Feb. 16, 2016.
Jacob et al. "Emergence of half-metallicity in suspended NiO chains: Ab initio electronic structure and quantum transport calculations" Physical Review B 74.8 (2006): 081402.
Jacob D. "Spin transport in nanocontacts and nanowires" arXiv preprint arXiv:0712.1383. Dec. 10, 2007.
Jacob et al. Spin filter behaviour of atomic NiO chains in Ni nanocontacts. In Nanotechnology Materials and Devices Conference, 2006. NMDC 2006. IEEE Oct. 22, 2006 (vol. 1, pp. 622-623). IEEE.
Kawahara, et al. "Large magnetoresistance through a single molecule due to a spin-split hybridized orbital" Nano letters 12.9 (2012): 4558-4563.
Parker et al. "Spin polarization of CrO 2 at and across an artificial barrier" Physical review letters 88.19 (2002): 196601.
Pauly et al. "Theoretical analysis of the conductance histograms and structural properties of Ag, Pt, and Ni nanocontacts" Physical Review B 74.23 (2006): 235106.
Ralph et al. "Spin transfer torques." Journal of Magnetism and Magnetic Materials 320.7 (2008): 1190-1216.
Rocha et al."Search for magnetoresistance in excess of 1000% in Ni point contacts: Density functional calculations" Physical Review B 76.5 (2007): 054435.
Rokhinson, et al. "Spin separation in cyclotron motion" Physical review letters 93.14 (2004): 146601.
Schmaus et al. "Giant magnetoresistance through a single molecule" Nature nanotechnology 6.3 (2011): 185.
Schmehl et al. "Epitaxial integration of the highly spin-polarized ferromagnetic semiconductor EuO with silicon and GaN." Nature materials 6.11 (2007): 882.
Soulen et al. "Measuring the spin polarization of a metal with a superconducting point contact" science 282.5386 (1998): 85-88.
Supplementary European Search Report for European Application No. 15860659.0 dated Jun. 5, 2018.
Thijssen et al. "Formation and properties of metal-oxygen atomic chains." New journal of physics 10.3 (2008): 033005.
Untiedt et al. "Absence of magnetically induced fractional quantization in atomic contacts" Physical Review B69.8 (2004): 081401.
Valenzuela et al. "Direct electronic measurement of the spin Hall effect" Nature 442.7099 (2006): 176.
Vardimon et al. "Experimental determination of conduction channels in atomic-scale conductors based on shot noise measurements." Physical Review B 88.16 (2013): 161404.
Vardimon et al. "Indication of Complete Spin Filtering in Atomic-Scale Nickel Oxide" Oxide letters. Jun. 10, 2015;15(6):3894.
Viret et al. "Magnetoresistance through a single nickel atom." Physical Review B 66.22 (2002): 220401.
Yoshida et al. "Gate-tunable large negative tunnel magnetoresistance in Ni—C60—Ni single molecule transistors." Nano letters 13.2 (2013): 481-485.

\* cited by examiner

Figure 2A
Sample I
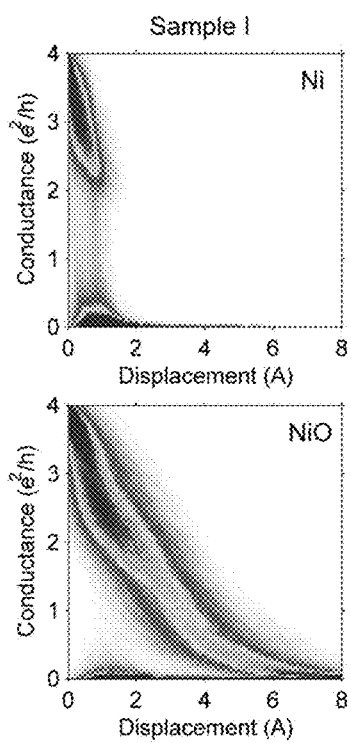
Figure 2B
Sample II
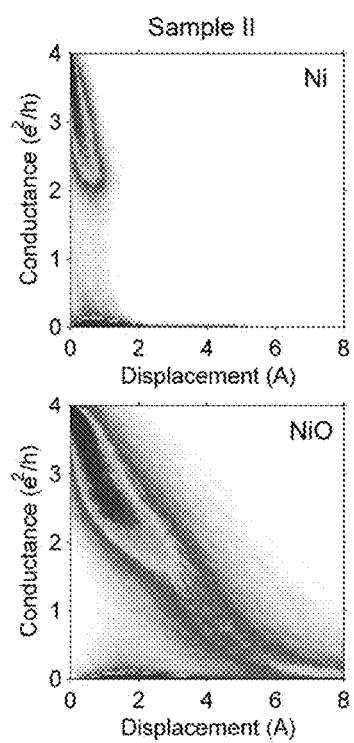
Figure 2C
Sample III
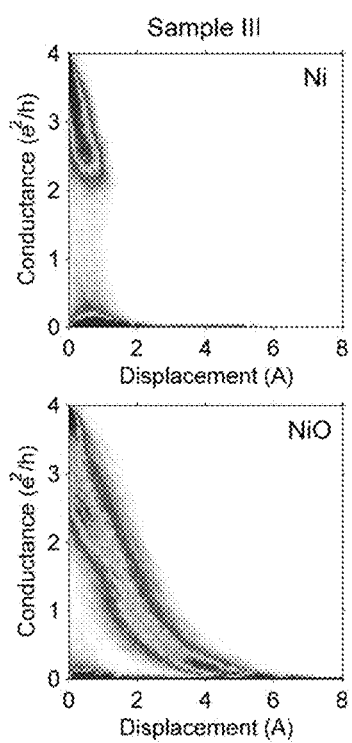
Figure 2D
Figure 2E
Figure 2F
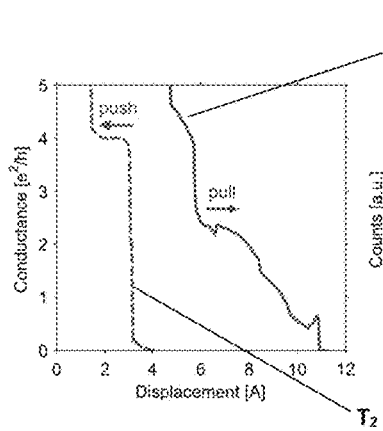
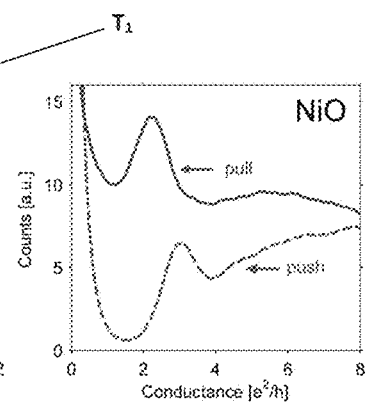
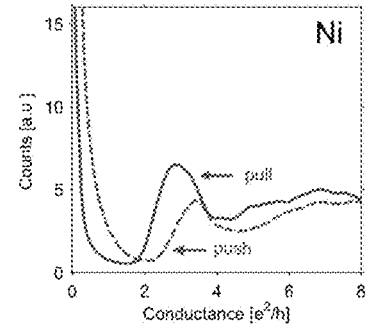
Figure 3A
Figure 3B
Figure 3C

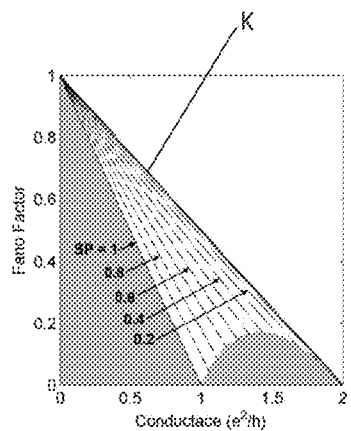
Figure 8A
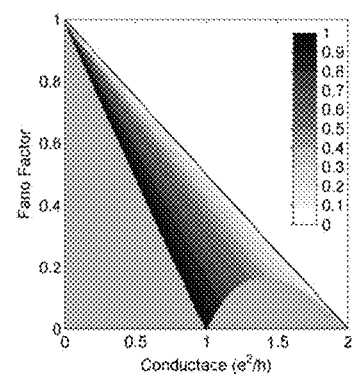
Figure 8B
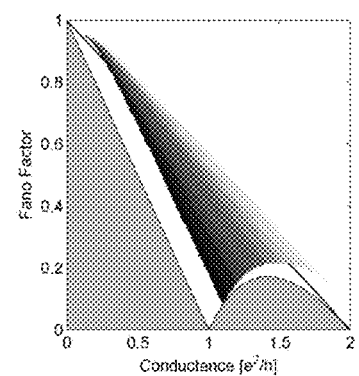
Figure 8C
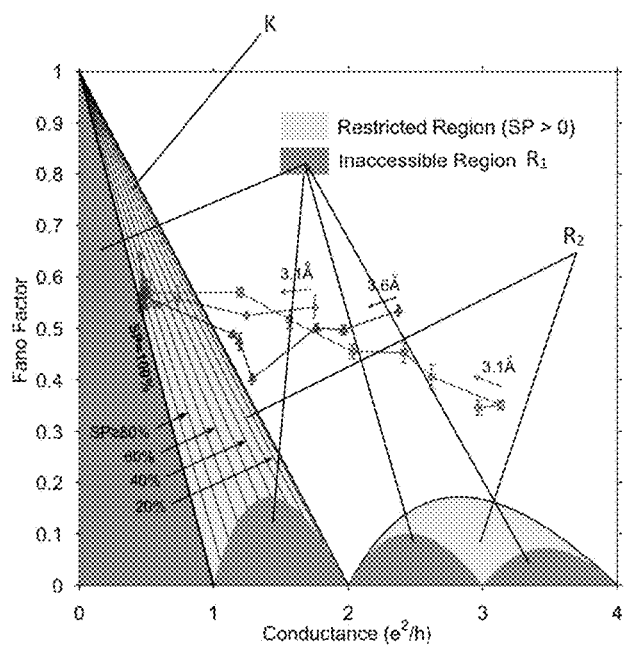
Figure 9A
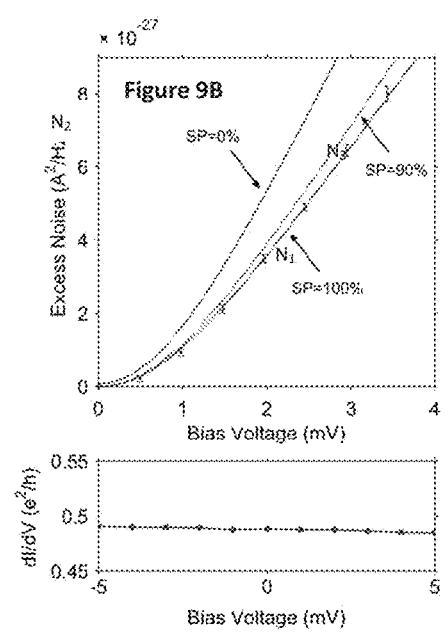
Figure 9B
Figure 9C

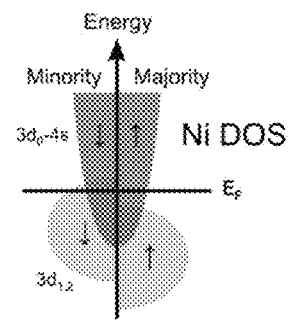
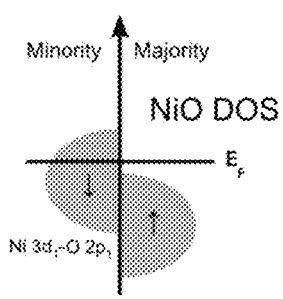
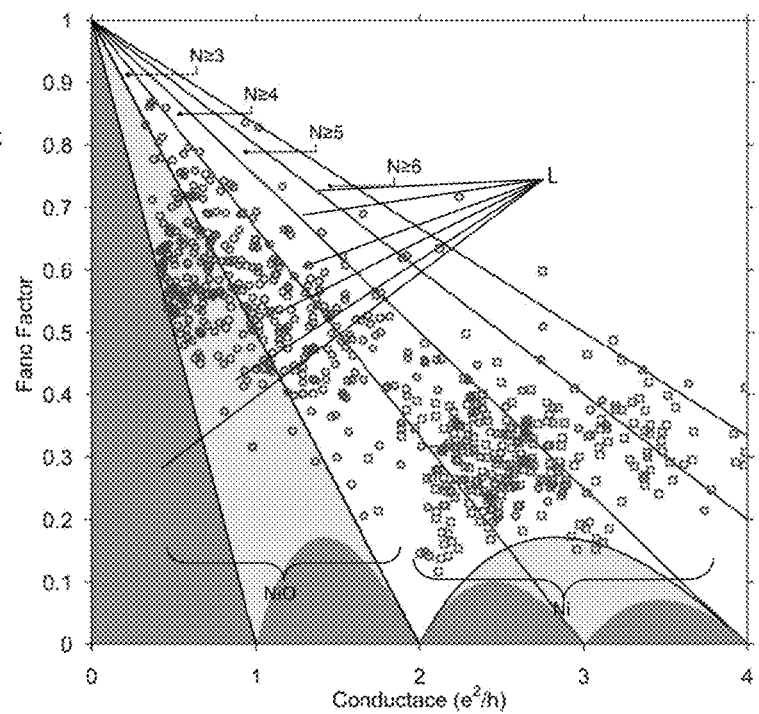
Figure 10A
Figure 10B
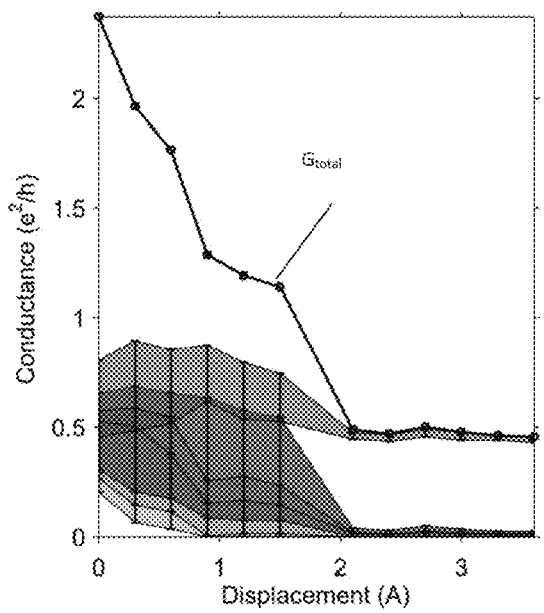
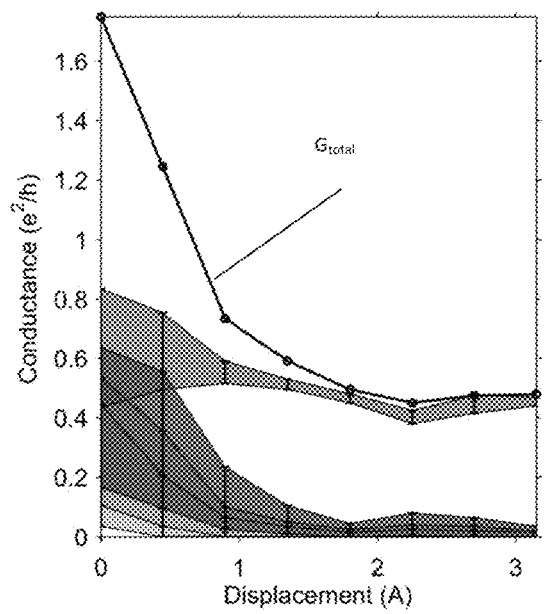
Figure 11A
Figure 11B

NANOSCALE ELECTRONIC SPIN FILTER

CROSS-REFERENCE TO RELATED APPLICATIONS

This application is a National Phase Application of PCT International Application No. PCT/IL2015/051115, International Filing Date Nov. 19, 2015, claiming priority from U.S. Provisional Patent Application No. 62/081,654, filed Nov. 19, 2014, which are hereby incorporated by reference.

FIELD OF THE INVENTION

The present invention is in the field of spintronics, and relates to a highly efficient spin filter device, such as a spin-polarizer or a spin valve, and a method for fabrication thereof.

BACKGROUND OF THE INVENTION

While conventional electronics is based on the charge of electrons, spintronics is based on exploiting the additional spin degree of freedom (in addition to the charge degree of freedom), which offers advantages for electronics and computing applications.

Controlling spin transport at the nanoscale is of particular interest because of the possibility to utilize interesting effects that emerge only at this scale. The ability to filter a highly spin-polarized current governed by electrons of a single spin type is of central importance for the efficient operation of spin-based devices. Methods for achieving spin-polarized currents at the length scale of several microns down to tenths of a micron include careful fabrication of structures based on half-metals, lateral separation of spin currents by magnetic field and the use of intrinsic effects as spin-orbit interactions.

There is a need in the art in novel nanoscale structures for spintronic components at the nanoscale, having an enhanced spin-filtering effect characterized by both high spin-polarization of the transmitted electronic current (95-100% of the current is spin polarized) and very large spin-current density ($\sim 10^{11}$ A cm$^{-2}$) so as to enable use of such structures in realization of atomic-scale spintronic applications, including very high magnetoresistance effects and significant spin-torque transfer.

As indicated above, spin-polarized currents can be achieved by careful fabrication of half-metals based structures, lateral separation of spin currents by magnetic field, and the use of intrinsic effects as spin-orbit interactions. However, when the system size is decreased toward the nanoscale, achieving high spin polarization has shown to become increasingly challenging. Alternative schemes explored at the nanoscale include atomic-scale ferromagnetic spin-valves based on atomic and molecular junctions. Yet, to date such experiments have indicated limited spin polarization, resulting in magnetoresistance values of a few tens of percent at the most.

SUMMARY OF THE INVENTION

Techniques of the present invention are aimed at providing a novel spin filter device enabling a new level of control over spin transport at small length scales. These techniques entail local engineering of the atomic-scale electronic structure. The inventors have shown that spin transport properties can be manipulated effectively by altering the local electronic structure of an atomic-sized constriction connecting two ferromagnetic electrodes. Since quantum confinement dictates that electronic transport is sensitive to the atomic composition of the constriction, manipulations at the single atom level can be expected to affect spin-transport to a large extent. One of the most important requirements for realization of efficient nanoscale spin-based electronics is the ability to produce currents dominated by a single electron spin type. The inventors have shown that the technique of the invention can be realized at the ultimate size limit of atomic scale contacts, resulting in an efficient spin-filter that can yield up to 100% spin-polarized currents.

The device of the present invention has high spin-polarized conductance, and due to the combination of high current density and high spin polarization, the device is ideal for nanoscale spin-valve devices or nanoscale devices based on spin torque transfer.

According to the invention, such a spin filter (at times referred to herein below as a spin-polarized conductor or spin valve) is formed by atomic-scale junctions including at least one atom of oxygen between two metal electrodes, or an atomic chain that contains metal and oxygen atoms where at least one oxygen atom is interconnected between the metal atoms. This configuration yields ultimate spin-polarized conductance.

The spin filter device of the invention is characterized by very high (up to about 100%) spin-polarized conductance realized in a nanoscale system due to the formation of an atomic metal-O-metal structure (O=oxygen) via hybridization between the p-orbitals of the oxygen atoms and the frontier d-orbitals of the metal. Generally, the spin filter device of the invention includes at least one atom of oxygen between two metal electrodes or an atomic chain formed by at least one oxygen atom in between two metal atoms. In general, the oxygen-metal atomic chain can be short serving as a spin filter, or serving also as a long spin current conductor. Suspended atomic chains with moderate length of several atoms were demonstrated. However, the length of atomic chains on a substrate can be substantially longer by the formation of NiO chains on substrates as surfaces. In such a configuration, the mentioned oxygen p-metal d selective orbital hybridization promotes the transmission of spin-polarized currents via the frontier d orbitals of the metal and suppresses the transmission of poorly spin polarized-currents via the frontier s orbitals of the metal.

Thus, according to one broad aspect of the invention, there is provided a spin filter device comprising two metal electrodes ended with low-coordinated surfaces and at least one atomic scale junction between said surfaces, said atomic scale junction comprising at least one oxygen atom or at least one atomic chain formed by atoms of the metal and oxygen atoms interconnected between the metal atoms, thereby enhancing a spin-filtering effect by selective p-d orbital hybridization between the p orbitals of oxygen and the d orbitals of the metal, promoting spin-polarized currents via the frontier d orbitals of the metal and suppressing the poorly spin polarized-currents via the frontier s orbitals of the metal.

The surface of the electrodes is made of the nanoscale low-coordinated structure based on ferromagnetic or anti-ferromagnetic metal that chemically reacts with oxygen.

According to another broad aspect of the invention, there is provided a method of fabrication of a nanoscale structure for use in a spin-polarized conductor or spin valve device. The method comprises: providing a wire (or a segment thereof) made of a ferromagnetic or antiferromagnetic metal structure; controllably elongating a region of the wire until identifying at least one predetermined elongation condition of the wire; forming two wire segments that act as two electrodes within said region and exposing at least said region of the wire to oxygen environment, thereby forming in said region an atomic scale junction comprising at least one oxygen atom or an atomic chain formed by the metal and oxygen atoms interconnected between the metal atoms, resulting in a selective p-d orbital hybridization between p orbitals of oxygen and d orbitals of the metal.

In some embodiment, the formation of the two wire segments comprises elongation of the wire to the point of rupture, or close to the point of rupture, such that two wire segments are formed with a gap between them. In some embodiment, the formation of the two wire segments comprises elongation of the wire to the point where along a critical wire segment, only one or a few metal atoms are present. These atoms (together with oxygen atom(s)) define a gap between two separate wire segments. In some embodiment, the formation of the two wire segments comprises elongation of the wire to the point where along a critical wire segment only one oxygen atom is present. This atom defines a gap between two metal wire segments. Other examples for the formation of two wire-segments and for the geometry/composition of the wire segments and of the gap between them are possible according to embodiments of the invention.

In some embodiments, the controllable elongation of the region of the wire comprises monitoring at least one parameter of the wire, e.g. a characteristic resistance of a single metal atom, conductance value, length of said region, and/or monitoring duration of the elongation process.

The step of exposing at least the region of the wire to the oxygen environment may comprise allowing oxidation of the wire surface and/or deposition of oxygen onto the wire surface within at least said region to thereby form metal-oxygen atomic chain(s) attached to the surface, or to thereby form a (metal-oxygen atom-metal) junction within said region.

The controllable elongation of the region of the wire and exposition of at least the region of the wire to the oxygen environment may be performed at least partially simultaneously.

The controllable elongation of the region of the wire and exposing to the oxygen environment may be performed while controlling the length of the atomic chain being formed.

In one embodiment, this invention provides a spin filter device comprising two metal electrodes ended with low-coordinated surfaces and at least one atomic scale junction between the surfaces, the atomic scale junction comprising:
at least one oxygen atom; or
at least one atomic chain formed by atoms of said metal and oxygen atoms interconnected between said metal atoms;
thereby enhancing a spin-filtering effect by selective p-d orbital hybridization between the p orbitals of the oxygen and the d orbitals of the metal, promoting spin-polarized currents via frontier d orbitals of the metal and suppressing poorly spin polarized-currents via frontier s orbitals of the metal.

In one embodiment, the electrodes are made of a nanoscale low-coordinated structure comprising ferromagnetic or antiferromagnetic metal that chemically reacts with oxygen.

In one embodiment, the metal electrodes comprise at least one of the following materials: nickel, cobalt, iron, alloys thereof. In one embodiment, the current flowing through said device is at least 50% spin polarized or at least 75% spin polarized or at least 90% spin polarized. In one embodiment, the device is operated at room temperature. In one embodiment, the device is used as a reading probe/head of magnetic information, a memory element, a conductor for spin polarized current, or a spin current polarizer/filter.

In one embodiment, this invention provides a method of fabrication of a spin filter device, the method comprising:
a providing a wire (or a segment thereof) made of a ferromagnetic or antiferromagnetic metal;
a controllably elongating a region of said wire until identifying at least one predetermined elongation condition of the wire;
a exposing at least said region of the wire to oxygen environment, thereby forming in said region an atomic scale junction comprising:
at least one oxygen atom: or
at least one atomic chain formed by atoms of said metal and oxygen atoms interconnected between the metal atoms;
resulting in a selective p-d orbital hybridization between the p orbitals of the oxygen and the d orbitals of the metal.

In one embodiment, controllably elongating the region of the wire comprises monitoring at least one parameter of the wire. In one embodiment, controllably elongating the region of the wire comprises monitoring the duration of the elongation process. In one embodiment, the at least one parameter of the wire being monitored comprises at least one of the following: a characteristic resistance of a single metal atom, conductance value, length of said region.

In one embodiment, the controllable elongation of the region of the wire and the exposing of the at least said region of the wire to the oxygen environment are performed at least partially simultaneously.

In one embodiment, the wire or a segment thereof is made of at least one of the following materials: nickel, cobalt, iron, alloys thereof.

In one embodiment, the controllable elongation of the region of the wire and the exposing of the at least said region of the wire to the oxygen environment comprise controlling a length of the atomic chain being formed. In one embodiment, the exposing of the at least elongated region of the wire to the oxygen environment comprises allowing at least partial oxidation of the wire surface to thereby form metal-oxygen atomic chain(s) attached to the surface. In one embodiment, the exposing of the at least elongated region of the wire to the oxygen environment comprises deposition of oxygen onto said at least elongated region of the wire.

In one embodiment, the metal comprises at least one of the following materials: nickel, cobalt, iron, alloys thereof.

In one embodiment, this invention provides a method of fabrication of the spin filter device, said method comprising: controllably depositing an oxygen atom, or metal and oxygen atoms, on a first substrate to form an oxygen junction or a metal-oxygen atomic chain(s) attached to the substrate.

In one embodiment, the at least two electrodes are fabricated on said substrate such that the tips of said electrodes are in contact with said metal-oxygen atomic chain or with an oxygen single atom. In one embodiment, the electrodes are fabricated prior to said deposition of oxygen or of metal and oxygen or following said deposition of oxygen or of metal and oxygen.

In one embodiment, the substrate is insulating. In one embodiment, portions of the substrate are insulating. In one embodiment insulating means electrically-insulating.

In one embodiment, following the oxygen deposition or the metal and oxygen deposition, a second substrate is brought into contact with the oxygen atom or with the metal-oxygen atomic chain(s), such that the first and second substrates form two electrodes in contact with the oxygen atom or with the metal-oxygen atomic chain(s).

In one embodiment, the first and second substrates or portions thereof are conductive. In one embodiment, the metal electrodes comprise at least one of the following materials: nickel, cobalt, iron, alloys thereof.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 1B and 1C show the density plots of conductance vs. inter-electrode displacement for Ni atomic contacts, before (FIG. 1B) and after (FIG. 1C) the introduction of oxygen.

FIGS. 2A-2F illustrate a comparison between the statistical analyses of conductance traces (conductance vs. length density plots) performed for three samples, before and after insertion of oxygen: sample I (FIGS. 2A, 2:D), sample II (FIGS. 2B, 2E) and sample III (FIGS. 2C, 2F);

FIGS. 3A to 3C exemplify trace recorded on a NiO junction when the junction is elongated and when the electrode tips are brought back to contact (FIG. 3A), and conductance histograms for NiO (FIG. 3B) and bare Ni (FIG. 3C);

FIGS. 7A-7B show an example of noise measurements measured on a nickel-oxygen junction (0.41 $e^2/h$) at different bias voltages, FIG. 7B shows corrected spectra after applying a peak-filter and correcting for a fitted RC transfer function, FIG. 7C shows the dependence of noise on bias voltage, and FIG. 7D shows noise dependence in reduced parameters;

FIGS. 8A-8C illustrate the analysis conducted by the inventors, where FIG. 8A shows Fano factor vs. conductance F(G) dependence obtained for different values of spin polarization SP for the case of two channels with opposite spins; FIG. 8B shows minimal spin polarization SP obtained numerically for up to four channels for different combinations of F and G; and FIG. 8C shows the resulting effect of additional two degenerate channels with the transmissions $\tau_\uparrow = \tau_\downarrow = 0.05$.

FIGS. 9A-9C illustrate lifting of spin-degeneracy in elongated NiO junctions, where FIG. 9A shows evolution of the Fano factor (F) and conductance (G) recorded for 3 elongation sequences (the total elongation is indicated for each sequence); FIG. 9B shows bias dependence of the excess noise S(V)−S(V=0) for an elongated NiO junction (G=0.49±0.01 $e^2/h$, F=0.53+0.02), and FIG. 9C shows dI/dV curve measured for the junction shown in FIG. 9B;

FIGS. 10A-10B schematically illustrate channel blocking via local orbital manipulation, where FIG. 10A is a schematic illustration of the density of states (DOS) for the Ni and NiO junctions, and FIG. 10B shows a statistical distribution of the Fano factor F and conductance G for an ensemble of Ni and NiO atomic scale junctions.

FIGS. 11A-11B show two examples for the conductance contribution of the four most conducting channels as a function of inter-electrode displacement, during the formation of NiO junctions.

Figure 1A:
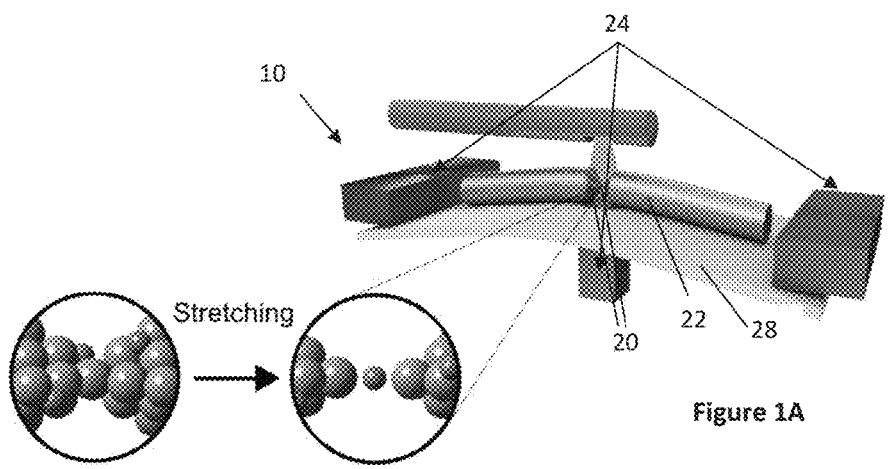
FIGS. 1A-1D illustrate experiments carried out by the inventors to investigate electronic spin transport in nickel-oxygen (NiO) junctions, where FIGS. 1A and 1D schematically illustrate the set up used for in-situ formation of a nickel-oxygen (NiO) atomic junction within the mechanically controllable break-junction setup.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The present invention provides a novel structure for a nanoscale electronic spin filter, enabling up to 100% spin-polarized current. The structure according to the invention includes an atomic-scale junction including at least one atom of oxygen between two metal electrodes or an atomic chain formed by at least one oxygen atom in between two metal atoms.

Materials

In one embodiment, devices of this invention comprise two electrodes comprising magnetic material, connected through at least one oxygen atom.

In devices described herein, the electrodes comprise a magnetic material. In one embodiment, the magnetic material is ferromagnetic. In one embodiment the magnetic material is antiferromagnetic. In one embodiment the magnetic material comprises Ni. In one embodiment, the magnetic material comprises Fe, Ni, Co, oxides thereof, alloys thereof and combinations thereof. In one embodiment, the magnetic material consists of Fe, Ni, Co, oxides thereof, alloys thereof and combinations thereof.

In some embodiments, in the devices described herein, the contact between the two electrodes comprises an oxygen atom. In one embodiment, the contact between the two electrodes comprises more than one oxygen atom. In one embodiment, the contact between the electrodes comprises metal atoms and oxygen atoms. In one embodiment, oxygen and metal atoms form the contacts between the electrodes. In one embodiment, the contact comprises at least one (metal atom-oxygen atom) pair wherein the metal atom is bonded to the oxygen atom. In one embodiment, any combination of metal atoms and oxygen atoms is possible for the contact between the electrodes, as long as at least one metal-oxygen bond or at least one metal-oxygen-metal bond exists in the contact. In one embodiment, the thickness of the contact (i.e., a dimension of the contact viewed perpendicular to the line connecting the tips of the electrodes is in the nanometer range or is less than a nanometer. In one embodiment, the incorporation of the oxygen atom(s) promotes spin-polarized current injection and suppresses unwanted spin degenerate (non-spin polarized) current injection through the junction. In one embodiment, the contact (the junction) does not comprise organic molecules. In one embodiment, the contact (the junction) does not comprise other non-metallic atoms.

In one embodiment, devices of this invention are stable over long periods of time. According to this aspect and in one embodiment, devices of this invention do not include temporary structures such as structures defined by a surface as a first electrode, a contact comprising oxygen atoms and a tip of a scanning tunneling microscope (STM) functioning as the second electrode.

In one embodiment, the contact comprising the at least one oxygen atom does not comprise graphene, graphite, carbon nanotubes, fullerenes and molecular derivatives thereof.

In one embodiment, the contact, the low coordination surface, portions thereof or a combination thereof is amorphous. In one embodiment, the contact, the low coordinated surface, portions thereof or a combination thereof is crystalline or polycrystalline. In one embodiment, the contact, the low coordinated surface, portions thereof or a combination thereof is in the form of nanoparticle, nanocluster, aggregate, nanotube, nanofiber, nanorod, nanowire, nanowhisker, nano dot, or a combination thereof.

In one embodiment, the contact comprising the at least one oxygen atom is attached to a substrate. In one embodiment, the substrate or the surface of the substrate comprises glass $SiO_2$, Si, doped Si, metal oxide, a polymer, organic monolayer, or any other organic or inorganic material. In one embodiment, the substrate or the surface of the substrate is conductive, is a semi-conductor or is an electrically-insulating material. In one embodiment, the substrate or the surface of the substrate is flexible or is non-flexible.

In one embodiment, the properties of atomic-scale junctions comprising metal atoms and oxygen atoms or comprising oxygen atoms between two metal surfaces differ from the properties of bulk metal-oxide material comprising the same metal.

Shape and Geometry

In one embodiment, devices of this invention comprise an atomic scale junction. In devices of the invention, at least one oxygen atom or a chain comprising oxygen atoms and magnetic metal atoms spans the distance between the surfaces of two magnetic materials (electrodes). In one embodiment, at least one magnetic material (electrode) is tapered/pointed or comprises a tapered/pointed tip. In one embodiment, the thinnest edge of the tapered/pointed material is the area where one side of the atomic scale junction is attached. In one embodiment, the tapered/pointed shape of the magnetic material (electrode) is of a regular or of an irregular form. In one embodiment, the tapered/pointed area is symmetric, asymmetric or of any symmetry degree.

Layered structure: in one embodiment, the electrodes and the atomic scale junction are arranged in a layered structure (e.g. a sandwich structure). According to this aspect and in one embodiment, the atomic scale junction, or a plurality of atomic scale junctions are arranged on the surface of the electrode(s). In such a configuration, the atomic scale junction(s) bridge the two electrodes (the two surfaces). One side of the junction is bonded to one surface (one electrode) and the other side of the junction is bonded to the other surface (the second electrode). The thickness of the atomic scale junction (i.e. the distance between the two electrodes can be determined by the amount of oxygen atoms/metal atoms used.

Junction composition: in one embodiment, only one oxygen atom is bounded between the two electrodes. In another embodiment, two or more oxygen atoms are bounded between the two electrodes. In one embodiment, 1-10 oxygen atoms bonded between the electrodes. In one embodiment, more than 10 oxygen atoms are bounded between the electrodes. In one embodiment, the oxygen atoms are arranged side by side on the surface of the electrode(s). In one embodiment, at least a portion of the oxygen atoms is attached to a first electrode. In one embodiment, at least a portion of the oxygen atoms is attached to the second electrode. In one embodiment, oxygen atoms are arranged as a string with metal atoms between them, such that the first atom is attached to the first electrode and the last atom on the string is attached to the second electrode. The metal/oxygen atoms between the first and the last atoms on the string are attached to one another in a row. In one embodiment, each oxygen or metal atom is viewed as a building block and the atoms in the junction are arranged as building blocks at any possible structure such that at least one atom is attached to the first electrode and at least one atom is attached to the second electrode and at least one oxygen atom is bonded to at least one metal atom. In one embodiment, 1-100, 1-1000, 1-10,000, 1-100,000, 1-1,000,000 oxygen atoms are located between the two electrodes. In one embodiment, the density of the atoms on the surface of the electrode is ranging between $1 \times 10^{10}$ and $1 \times 10^{15}$ atoms per $cm^2$. In one embodiment, the density of the atoms on the surface of the electrode is up to $1 \times 10^{15}$ atoms per $cm^2$. In one embodiment, oxygen atoms that are arranged on the surface of an electrode are isolated from one another. In one embodiment, numerous oxygen atoms are each connected to two electrode surfaces, while each oxygen atom is spaced apart or is chemically isolated from neighboring oxygen atoms on the surface of the electrode(s). In other embodiments, at least two oxygen atoms may be connected to each other in portions of devices of this invention.

Devices of this invention and methods of production thereof allow control over the electric response of the device. Devices of this invention and methods of production thereof allow high spin-polarization of currents flowing through the junction.

In one embodiment, during deposition of the atom(s), both the atoms and the magnetic metal are in a highly pure form. Both the surface of the magnetic metal and the atom(s) are clean and practically lack impurities and contaminations. Such purity enables the formation of the desired hybridization between oxygen atomic orbitals and orbitals of the ferromagnetic material. Such pure conditions are achieved using pure starting materials, using high vacuum or ultra-high vacuum conditions during processing and in some embodiments, by surface cleaning methods.

In some embodiments the existence of metal atoms protruding from the metal surface enables the formation of the desired hybridization between oxygen atomic orbitals and d orbitals of the ferromagnetic material.

Dimensions and Values

In one embodiment, the thickness of the magnetic material (electrodes) ranges between 0.1 nm to 1 centimeter.

In one embodiment, the spacing between the electrodes (i.e. the length of the atomic scale junction(s) is ranging between 0.1 nm (1 Å) 1.0 nanometers, or between 0.1 nm (1 Å) and 10 nanometers or between 0.1 nm (1 Å) 100 nanometers.

In one embodiment, devices of this invention are operated at any temperature. In one embodiment, devices of this invention are operated at room temperature. In one embodiment, devices of this invention are operated at 0° C.±10° C. In one embodiment, devices of this invention are operated at −78° C.±10° C. In one embodiment, devices of this invention are operated at −195° C.±10° C. In one embodiment, devices of this invention are operated at about 4° K. In one embodiment, devices of this invention are operated at a temperature range of −50° C. and +50° C.

In one embodiment, the % spin polarization for devices of this invention ranges between 0% and 100%. In one embodiment, the % spin polarization for devices of this invention ranges between 10% and 90% or between 50% and 100%. In one embodiment, the % spin polarization for devices of this invention ranges between 50% and 90% or between 25% and 75%, or between 20% and 80%, or between 80% and 100%, or between 80% and 90%. In one embodiment, the % spin polarization for devices of this invention is higher than 50%. In one embodiment, the % spin polarization for devices of this invention is higher than 80%. In one embodiment, the % spin polarization for devices of this invention is higher than 90%. In one embodiment, the % spin polarization for devices of higher than 95%, higher than 70%, higher than 60%, higher than 40%.

In one embodiment, the current density (on the order of $10^{11}$ A cm$^{-2}$) in devices of the invention is high enough to be detected using simple means. In one embodiment, the current density in devices of this invention is higher than $10^{10}$ A cm$^{-2}$, or is higher than $10^{11}$ A cm$^{-2}$, or is higher than $10^{12}$ A cm$^{-2}$. In another embodiment, devices of this invention have higher or lower current densities.

In one embodiment, devices of this invention exhibit both high % spin polarization and large current density. According to this aspect and in one embodiment, the % spin polarization ranges described herein above, characterize devices of this invention wherein the current density is of the order of $10^{11}$ A cm$^{-2}$ or wherein the current density is in one of the ranges described herein above. Accordingly, devices of this invention exhibit large current density and high % spin polarization. For example, a device wherein the % spin polarization ranges between 75% and 100%, exhibit current density of about $10^{11}$ A cm$^{-2}$ or exhibit current density of at least $10^{10}$ A cm$^{-2}$.

Devices

In one embodiment, this invention provides a spin filter device comprising two metal electrodes ended with low-coordinated surfaces and at least one atomic scale junction between the surfaces, the atomic scale junction comprising:
at least one oxygen atom; or
an atomic chain formed by atoms of the metal and oxygen atoms interconnected between the metal atoms;
thereby enhancing a spin-filtering effect by selective p-d orbital hybridization between the p orbitals of the oxygen and the d orbitals of the metal, promoting spin-polarized currents via frontier d orbitals of the metal and suppressing poorly spin polarized-currents via frontier s orbitals of the metal.

In one embodiment, the electrodes are made of a nanoscale low-coordinated structure comprising ferromagnetic or antiferromagnetic metal that chemically reacts with oxygen.

In one embodiment, the length of the atomic chain in said atomic scale junction is selected such that the device is operable as a spin filter. In one embodiment, the length of the atomic chain in the atomic scale junction is selected such that the device is operable as a spin current conductor.

In one embodiment, the metal electrodes comprise at least one of the following materials: nickel, cobalt, iron, alloys thereof. In one embodiment, the metal electrodes consist of at least one of the following materials: nickel, cobalt, iron, alloys thereof. In one embodiment, the electrodes consist of nickel. In one embodiment, the electrodes consist of iron.

In one embodiment, the atomic scale junction comprises at least one of the following materials: nickel, cobalt, iron, alloys thereof. In one embodiment, the atomic scale junction consist s of at least one of the following materials: nickel, cobalt, iron, alloys thereof, oxygen. In one embodiment, the atomic scale junction consists of nickel and oxygen. In one embodiment, the atomic scale junction consists of iron and oxygen. In one embodiment, the atomic scale junction consists of cobalt and oxygen.

In one embodiment, the current flowing through the device is at least 50% spin polarized, or at least 75% spin polarized, or at least 90% spin polarized.

In one embodiment, the device is operated at room temperature.

In one embodiment, the device or the described structures are used as a reading probe/head of magnetic information, a memory element, a conductor for spin polarized current, or a spin current polarizer/filter.

In one embodiment, devices of the invention comprise two magnetic materials and an oxygen atom or a series of metal/oxygen atoms located between the two magnetic materials. In one embodiment, devices of this invention further comprise electrical contacts, power supply, electronics, current meter, temperature controllers/cooling means, sensors, processors, other electrical components, computer, mechanical and electrical stabilizing components, a display, converters, amplifiers, noise-reduction elements, signaling elements, light/voice components, magnets, magnetic components, and any other component related to spin-polarized current devices as known to a person of ordinary skill in the art.

In one embodiment, this invention provides a spin polarizing device comprising at least one electrode, the electrode comprising a surface, wherein the surface comprising a ferromagnetic material, wherein the surface is attached to at least one oxygen atom, such that the oxygen atom is coupled to the surface via p-d hybridization between p orbitals of the oxygen atom and d orbitals of the ferromagnetic material.

In one embodiment, the surface is corrugated/rough, thereby promoting said p-d hybridization. In one embodiment, the corrugated/rough surface provides certain reactivity of the surface toward the oxygen atom(s). In one embodiment, the electrode comprises Ni.

In one embodiment, the device further comprises a second electrode, the second electrode comprises a surface, the surface at least partially facing the first electrode. In one embodiment, the at least one oxygen atom is attached to the surface of the first electrode and the same atom or another oxygen atom in a string of atoms is attached to a surface of the second electrode. In one embodiment, the surface of the second electrode comprises a ferromagnetic material, wherein the attachment of the oxygen atom to the surface comprises coupling of the oxygen atom to the surface via p-d hybridization between p orbitals of the oxygen atom and d orbitals of the ferromagnetic material. In one embodiment, the electrodes are configured as crossing wires with the oxygen atom or the string/structure comprising the oxygen atom(s) in between the crossing wires. In one embodiment, the oxygen atom/structure comprising oxygen atom(s) act as a transport medium between the electrodes, thereby increasing selectivity of spin transport between the electrodes, thus increasing spin filtering or spin current conduction effects in the device.

In one embodiment, this invention provides spin filter or spin current conduction devices as described herein above, wherein the devices comprise an array of atomic-scale junctions, each formed by oxygen atom(s) or by structures/strings comprising oxygen atom(s), the junctions bridging ferromagnetic surfaces of two electrodes, wherein at least one oxygen atom per junction is coupled to the ferromagnetic surface of at least one of the electrodes via p-d hybridization of p orbitals of the oxygen and d orbitals of the ferromagnetic material of the electrode.

In one embodiment, this invention provides a layered device comprising:

a first magnetic material layer;

an array of isolated atomic-scale junctions comprising at least one oxygen atom, each junction comprising a first end and a second end; and a second magnetic material layer;

wherein the first end of at least a portion of the atomic-scale junctions is in contact with the first magnetic material layer and wherein the second end of at least a portion of the atomic-scale junctions is in contact with the second magnetic material layer, such that:

oxygen atoms in the first end are coupled to the first magnetic material layer via p-d hybridization between p molecular orbitals of the oxygen and d orbitals of the magnetic material; and oxygen atoms in the second end are coupled to the second magnetic material layer via p-d hybridization between p oxygen orbitals and d orbitals of the magnetic material.

According to this aspect and in one embodiment, at least a portion of the atomic-scale junctions described above are connected to both the magnetic material layers such that the first end of an atomic junction is in contact with the first magnetic layer and the second end of an atomic scale junction is in contact with the second magnetic material layer. In one embodiment, the magnetic material is ferromagnetic or antiferromagnetic. In one embodiment, the device is operated at room temperature. In one embodiment, the thickness of said atomic-scale junction (the distance between the two electrodes) ranges between 0.2 nm and 100 nm. In one embodiment, the device is a spin filter and/or a spin current conduction device. In one embodiment, % spin polarization in the devices ranges between 10% and 100%. In one embodiment, the % spin polarization in the devices ranges between 50% and 100%. The % spin polarization in the devices is at least 50%, at least 60% at least 70%, at least 80%, at least 90%, or at least 95% in embodiments of this invention.

In one embodiment, the ferromagnetic material comprises Fe, Ni, Co, alloys thereof and combinations thereof.

In one embodiment, devices of this invention comprise an atomic-scale junction comprising a structure comprising metal atoms and oxygen atoms. According to this aspect and in one embodiment, devices of this invention comprise an (M—O) or (M—O—M) structure wherein "M" represents a magnetic metal atom and "O" represents an oxygen atom. The number of "M" and "O" atoms and the number of (M—O) and (M—O—M) units can be any number that may fit within an atomic scale junction.

Methods of Producing

In one embodiment, this invention provides a method of fabrication of a spin filter device, the method comprising:

a providing a wire made of a ferromagnetic or antiferromagnetic metal;

controllably elongating a region of the wire until identifying at least one predetermined elongation condition of the wire;

exposing at least said region of the wire to oxygen environment, thereby forming in the region an atomic scale junction comprising:

at least one oxygen atom: or an atomic chain formed by the metal and oxygen atoms interconnected between the metal atoms;

resulting in a selective p-d orbital hybridization between p orbitals of the oxygen and the d orbitals of the metal.

In one embodiment, controllably elongating the region of the wire comprises monitoring at least one parameter of the wire. In one embodiment, controllably elongating the region of the wire comprises monitoring a duration of the elongation process. In one embodiment, the at least one parameter of the wire being monitored comprises at least one of the following: a characteristic resistance of a single metal atom, conductance value, length of the region. In one embodiment, the controllable elongation of the region of the wire and the exposing of the at least said region of the wire to the oxygen environment are performed at least partially simultaneously.

In one embodiment, the wire is made of at least one of the following materials: nickel, cobalt, iron, alloys thereof.

In one embodiment, controllable elongation of the region of the wire and exposing of the at least said region of the wire to the oxygen environment comprise controlling a length of the atomic chain being formed.

In one embodiment, exposing of the at least elongated region of the wire to the oxygen environment comprises allowing at least partial oxidation of the wire surface to thereby form metal-oxygen atomic chains attached to the surface.

In one embodiment, exposing of the at least elongated region of the wire to the oxygen environment comprises deposition of oxygen onto said at least elongated region of the wire. In one embodiment, the metal comprises at least one of the following materials: nickel, cobalt, iron, alloys thereof.

In one embodiment, this invention provides a method of fabrication of a spin filter device, the method comprising:

controllably depositing oxygen atom(s) or controllably depositing metal atoms and oxygen atoms on a first substrate to form oxygen junction(s) or metal-oxygen atomic chains attached to the substrate.

In one embodiment, at least two electrodes are fabricated on said substrate such that the tips of said electrodes are in contact with said oxygen atom or with the metal-oxygen atomic chain.

In one embodiment, the electrodes are fabricated prior to the deposition of oxygen(s) atoms or prior to the deposition of metal and oxygen or following said deposition of oxygen(s) atoms or of metal and oxygen atoms. In one embodiment, one electrode is fabricated prior to the deposition of oxygen or of metal and oxygen and the other electrode is fabricated following the deposition oxygen or of metal and oxygen.

In one embodiment, the substrate is insulating.

In one embodiment, following oxygen or metal and oxygen deposition, a second substrate is brought into contact with the metal-oxygen atomic chains, such that the first and second substrates form two electrodes in contact with the metal-oxygen atomic chains.

In one embodiment, the first and second substrates or portions thereof are conductive.

In one embodiment, the electrodes are metal electrodes. In one embodiment, the electrodes comprise at least one of the following materials: nickel, cobalt, iron, alloys thereof.

In one embodiment, devices of this invention comprise a structure comprising an oxygen atom, or a collection of atoms comprising at least one oxygen atom and metal atoms. The structure is spanning two low coordinated surfaces comprising magnetic metal(s). In one embodiment such structure is formed by the mechanical break junction technique as illustrated in Example 1, and in FIGS. 1A and 1D.

In other embodiments, structures of this invention comprising an oxygen atom, or a collection of atoms comprising at least one oxygen atom and metal atoms between two magnetic materials are formed by one or more of the following methods: using the electromigration technique, by deposition from solution (e.g. electrodeposition or electroless deposition, saturation, centrifugation), by vapor phase deposition/evaporation methods such as PVD, CVD, e-beam evaporation or resistive heating evaporation. In other embodiments, the structures are formed by methods including a movable tip and a surface such as STM and AFM. In one embodiment structures of this invention utilize self-assembly of atoms/molecules from solution or from a vapor phase onto a surface. In another embodiment, e-beam lithography involving various exposure parameters is used to form thin junctions between two magnetic materials, junctions into which oxygen atom(s) can he incorporated. Methods involving stamping, molding, soft lithography, UV and e-beam lithography and related methods can be used to pattern/form atomic-scale contact(s) in devices of this invention. Methods involving wet etching, dry etching, resist application and lift-off, spin-coating, drop casting and relevant methods can be used to pattern/form the junction and any other component in devices of this invention. Combinations of techniques from the list described above may be useful to construct devices of this invention. Any other method can be used to form structures of this invention as known to the skilled artisan.

In some embodiments, roughening of the electrode surfaces is conducted in order to generate low-coordinated or less coordinated surface sites. In order to roughen the electrode surfaces (and other intermediate surfaces as needed) prior to oxygen adsorption, various techniques may be employed. The mechanical break junction method, electromigration, wet or dry etching, other mechanical and chemical surface roughening methods, electrochemical methods, temperature variations, sputtering, evaporation under certain conditions (e.g. certain evaporation rate/certain substrate temperature), any of the methods described herein above and any other method as known to a person of ordinary skill in the art.

In one embodiment, more than one atomic-scale junction is present between the surfaces of two electrodes. In one embodiment, two atomic-scale junctions are present between the two electrodes. In one embodiment, two or more atomic-scale junctions are present between the two electrodes. In one embodiment, multiple atomic-scale junctions are arranged side-by-side on the surface of the electrode. Multiple atomic junctions between the surfaces of the two electrodes can be arranged in an ordered manner in one embodiment, in a disordered or random manner in another embodiment, or with a combination thereof.

In one embodiment, the size of the surface (length X width) of the magnetic metal surface of the electrodes is larger than the nanometer range (e.g. the surface size ranges between 1 μm and 1 cm). In other embodiments, the dimensions of the magnetic metal surface are in the nanometer range.

In one embodiment, the magnetic metal surface does not comprise a quantum dot. In another embodiment, the magnetic metal surface is or comprises a quantum dot.

In one embodiment, devices of the invention further comprise electrical contacts. Methods of formation/construction of electrical contacts are known in the art.

In one embodiment, in devices wherein more than one junction is present between two electrodes (between two surfaces), the junctions are not in contact with each other and are chemically isolated one from the other. In one embodiment, various atomic-scale junctions on the surface of an electrode are in dose proximity, such that the separation between the junctions is less than 1 nm or less than 0.2 nm in one embodiment.

Uses/Methods of Use

In one embodiment, devices of this invention are used in/as a reading probe/head of magnetic information. In one embodiment, devices of this invention are used in/as a memory element. In one embodiment, devices of this invention are used in a conductor for spin polarized current. In one embodiment, devices of this invention are used in/as spin current polarizer/filter.

Definitions:

In one embodiment, atomic-scale junctions are junctions comprising one atom in between two electrodes or in between two tips, or in between two electrode tips, or in between two surfaces. In one embodiment, atomic-scale junctions comprise more than one atom. According to this aspect and in one embodiment, atomic-scale junctions comprise, 2-10 atoms, a chain of atoms, a few atoms, a structure comprising a small number of atoms, a nano-scale structure, a sub-nanoscale structure, a cluster comprising a small number of atoms, a molecule, a few molecules, a small group of molecules, a chain of molecules etc. In one embodiment, the electronic and magnetic behavior of an atomic-scale junction as described above is different from the behavior of a bulk material comprising the same atoms/molecules. In one embodiment, junctions of the invention are referred to as contacts. In one embodiment, the junction contacts the two electrodes. In one embodiment, the junctions form the contact between the two electrodes (between two low-coordinated surfaces).

In other embodiments, the term contact refers to the electrodes. The electrodes contact the junction. In other embodiments, contacts are electrical contacts that are bonded or attached to the electrodes in order to connect the electrodes to other elements/components such as power supply/measurement devices etc. The term contact is thus used in different context in various embodiments of this invention.

In one embodiment, low-coordinated surface means a surface wherein some of the atoms are low-coordinated. In one embodiment, in a low-coordinated surface, the coordination degree of at least some of the atoms is less than the coordination degree of atoms in a bulk material. In one embodiment, in a low-coordinated surface, the coordination degree of at least some of the atoms is less than the coordination degree of surface atoms of a smooth surface. In one embodiment, low coordinated surface comprise low-coordinated surface sites. In one embodiment, atomic-scale junctions of this invention are attached to low-coordinated surface sites. In one embodiment, low-coordinated surfaces are formed by single atoms, two or more atoms, two-ten atoms, clusters, aggregates, dots, molecule(s), nano-structures, sub-nanostructures, rough surfaces, patterned surfaces, physically- or chemically-modified surfaces, sputtered surfaces partially-oxidized surfaces, surfaces comprising nano-spheres etc. In one embodiment, low-coordinated surfaces comprise low coordinated atoms, low-coordinated clusters, low-coordinated sites, low-coordinated surface sites, the edges of a surface, the corner(s) of a surface, perimeter of the surface, ad-atoms on the surface, ad-atoms on the edge/corner of the surface, surface steps or portions thereof, outer or outer-most portions of the surface, regions/areas outside the surface, etc. In one embodiment, low-coordinated surfaces are or comprise rough surface, corrugated surface, microscopically-rough surfaces, surface comprising nanoscale roughness, non-smooth surfaces, non-microscopically-flat surfaces etc. In some embodiments, the term low coordinated surface refers to a nanoscale low-coordinated structure or metal ended with a low-coordinated surface (that is, a structure that contains atoms with low number of neighboring atoms). Low coordinated surface may be a very thin wire, the tips of a very thin wire, the ad-atoms on a smooth surface, the edges of a surface, steps on a surface, areas on corrugated surfaces, an atomically-rough surface, a nanometer-scale rough surface, a protruding atom(s) from a surface, a patterned surface comprising patterns embedded or protruding from the surface, a nano-particle, an aggregate of atoms, a cluster(s) of atoms, a small molecule, any nanostructure including but not limited to a pillar, a rod, a whisker, a nanodot, a nanosphere, a wire of atoms, a molecular wire, an atomic chain, a molecular chain, or any combination thereof.

In some embodiments, the low coordinated surface of the metal is based on ferromagnetic or antiferromagnetic metal that is capable of reacting chemically with oxygen. Such a metal may be, but not limited to, nickel, cobalt, iron and their alloys.

In one embodiment, surfaces of this invention are rough. In one embodiment, rough surfaces comprise low-coordinated atoms, and/or low-coordinated surface sites. In one embodiment, roughness of a surface is the texture or the topography of the surface. Rough surfaces are non-flat surfaces (microscopically). In one embodiment, roughness of a surface is measured by profile roughness Ra. For example, Ra is the average of the absolute values of the profile height deviations from the mean line, recorded within a certain length. Ra is the average of a set of individual measurements of surface peaks and valleys. In one embodiment, surfaces of this invention are corrugated. In one embodiment, corrugated means comprising a series of parallel ridges and furrows. In one embodiment, corrugated means rough. In one embodiment, corrugated is not flat. In one embodiment, the surface of the magnetic metal is microscopically rough. In one embodiment, microscopical roughness cannot be seen by the naked eye.

In one embodiment, microscopically-rough means that the roughness can be imaged/detected/determined using microscopy techniques. In another embodiment, microscopical roughness is too fine and cannot be imaged/detected/determined using current microscopy techniques. However, such microscopical roughness exists and affects the surface properties. In one embodiment, in microscopically-rough surfaces, the roughness is an atomic-level roughness. Atomic-level roughness may include atomic steps, atomic protrusions and atoms residing on an atomically-flat surface. In one embodiment, microscopically rough surface may appear flat to the naked eye. Accordingly, a surface can be macroscopically flat and microscopically rough.

In some embodiments, "attached to" means associated with, coupled to, bonded to, placed at close proximity to, influencing and being influenced by, related, linked or connected to the entity to which it is attached. All such relationships between coupled materials may include chemical and physical interactions between the coupled materials.

Conductance is the reciprocal of resistance. Conductance may be measured by applying voltage to a system/component and measuring current, thus extracting the resistance and the conductance. Conductance may be measured, stated or defined by $G_O$ and corresponding values as described herein. For spin-degenerated systems $G_O=2$ $e^2h \cong 1/12.9$ kOhm, is the conductance quantum, where e is the electronic charge and h is Plank's constant. For spin polarized systems $G_O=e^2/h$ may be used. Conductance may also be measured in units of S (siemens). One siemens is equal to the reciprocal of one ohm.

Break junction is the term used to describe a small junction formed between two electrical contacts. The name break-junction refers to the way of forming the junction which involves breaking a very thin wire or constriction using mechanical means (usually by bending).

In one embodiment, spin filter can be formed by a very short junction, e.g. even one atom of oxygen between two metal electrodes may form a spin filter. The spin filter filters the current to have a current that is dominated by one electron spin-type.

In one embodiment, the goal of a spin conductor is to transmit spin current from one location to another location (hence it should be long) while preserving highly spin-polarized current (avoiding spin-flip events that generate the other type of spin current and reduce the degree of spin polarization). A chain of metal/oxygen atoms form a spin current conductor in one embodiment.

In one embodiment, the term "a" or "one" or "an" refers to at least one. In one embodiment the phrase "two or more" may be of any denomination, which will suit a particular purpose. In one embodiment, "about" or "approximately" may comprise a deviance from the indicated term of +%, or in some embodiments, −1%, or in some embodiments ±2.5%, or in some embodiments, ±5%, or in some embodiments, ±7.5%, or in some embodiments, ±10%, or in some embodiments, ±15%, or in some embodiments, ±20%, or in some embodiments, ±25%.

The following is the description of some examples and experiments carried out by the inventors. In these examples and experiment, Ni was used as low-coordinated metal. It should, however, be noted that the invention is not limited to this specific material, and any low-coordinated metal can be used.

EXAMPLES

Example 1

Formation of a Junction and Conductance Measurements

Figure 1B:
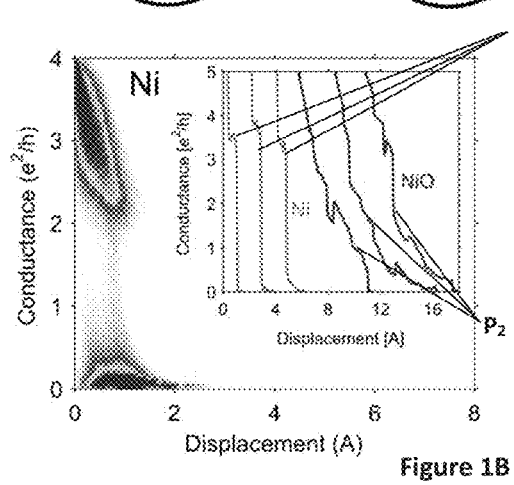
Figure 1C:
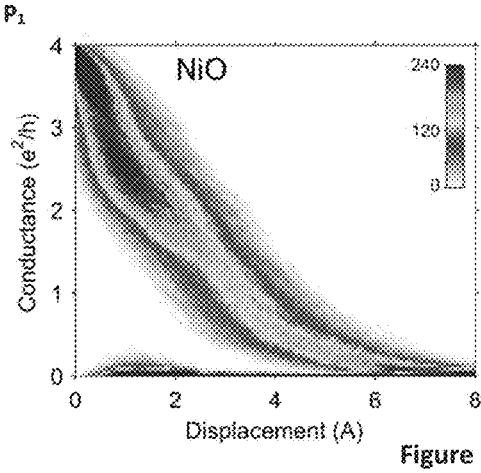
Figure 1D:
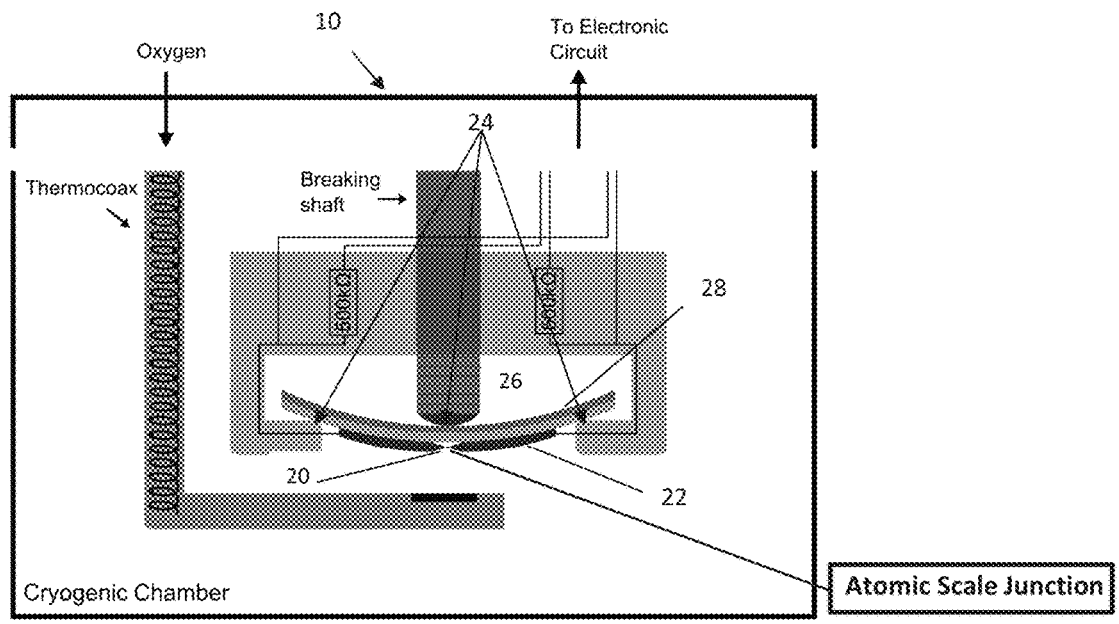

Reference is made to FIGS. 1A-1D describing experiments carried out by the inventors to investigate electronic spin transport in nickel-oxygen (NiO) junctions. FIGS. 1A and 1D schematically illustrate set ups 10 used for in-situ formation of a nickel-oxygen (NiO) atomic junction within the mechanical break junction setup. FIGS. 1B and 1C show the density plots of conductance vs. inter-electrode displacement for Ni atomic contacts, before (FIG. 1B) and after (FIG. 1C) the introduction of oxygen. In this experiment, the NiO atomic junction was formed in cryogenic conditions (4.2K) using the break-junction setup 10.

As a first step, Ni atomic contacts 20 were created by breaking a Ni wire 22 using a 3-point bending mechanism, generally designated 24, driven by a piezoelectric element 26 (FIG. 1D). As shown more specifically in FIG. 1D, the mechanically controllable break junction setup 10 is located within a cryogenic chamber that is pumped to $10^{-5}$ mbar and cooled to liquid helium temperature (4.2K). The sample consists of a notched Ni wire (99.98%, 0.125 mm diameter) which is attached to a flexible substrate 28 (1 mm thick phosphor bronze plate covered by a 100 µm thick insulating Kapton film). The three-point bending mechanism 24 is used to bend the substrate in order to break the wire at the notch. The wire is first broken under cryogenic temperatures, resulting in the exposure of two clean atomically-sharp tips 20. The breaking process is controlled by a piezoelectric element 26 (PI P-882 PICMA), which is driven by a piezo driver, allowing fast and accurate control of the relative tip displacement with sub-Angstrom resolution.

During the breaking process the contact area was locally narrowed in a controllable fashion, and the conductance was measured as a function of the relative displacement of the two wire segments (FIG. 1C, inset, curves $P_1$). The evolution of conductance during the breaking process is characterized by collecting thousands of such repeated conductance traces in a 2D density plot of conductance vs. inter-electrode displacement (FIG. 1C).

In order to record conductance traces, the DC conductance was monitored while the contact was gradually broken by linearly increasing the voltage applied on the piezoelectric element (at a constant speed of 600 nm/s and a sampling rate of 200 kHz). The junction is biased with a constant voltage of 10-200 mV. The resulting current is amplified by a current preamplifier and recorded. Following each trace, the exposed atomic tips were pushed back into contact until the conductance reaches a value of at least 100 $e^2/h$, in order to ensure that the data consists of a statistical variety of different atomic neck geometries.

Differential conductance (dI/dV/) measurements were performed using a standard lock-in technique. A reference sine signal of 2 mVpp at ~3 kHz modulating a DC bias voltage was generated, the AC response was recorded and extracted by a (e.g. LabView implemented lock-in analysis) to obtain the dI/dV response as a function of bias voltage.

The typical conductance right before breaking of the Ni contact is 2-4$G_0$ ($G_0=e^2/h$ is the conductance quantum) corresponding to the conductance of an impurity-free contact with a single Ni atom at the smallest cross-section. The single-atom contact can be elongated by up to approximately 1 Å, after which the conductance drops abruptly, indicting the breakdown of the contact.

To determine the inter-electrode distance, the ratio k between the relative tip displacement Δx and the voltage difference $\Delta V_p$ applied on the piezoelectric element was measured. The inventors used the established procedure based on the exponential dependence of the junction resistance on the inter-electrode displacement in the tunneling regime. The calibration was performed for bare Ni atomic contacts. The calibration ratio can be determined from the relation:

$$k = \frac{\Delta x}{\Delta V_p} = \frac{\hbar}{2\sqrt{2m\phi}} \frac{\partial (\ln R)}{\partial V_p} \quad (1)$$

where R, m, ϕ are the resistance, electron mass, and the work function of Ni, for which the bulk value of ϕ=5.15 eV was used.

The value of k was calculated from fitting the resistance curves for an ensemble of 10,000 traces, recorded as the electrode apexes were brought to contact. The obtained value of k is 15±3 Å/V. The variance in the calculated calibration values is attributed to the dependence of the actual work function on the different tip configurations sampled.

Following the formation of atomic-scale Ni contacts, oxygen gas (99.999% purity) was introduced into the cryogenic chamber, towards the center of the contact, via a heated capillary connecting an external molecular source with the cryogenic environment (FIGS. 1A, 1B). Before measurements, the capillary was baked-out overnight at 100° C. and washed by oxygen gas several times in order to ensure that oxygen is the dominant contaminant. The break junction system was kept at high vacuum ($10^{-6}$ mbar) and then cooled down to 4.2K to reach cryogenic vacuum conditions. Measurements on bare nickel contacts lasted for a few days, in which the junction was found to exhibit the electronic characteristics of an impurity-free nickel contacts. Once the molecule insertion procedure started, the capillary was heated in order to avoid premature condensation of the gas using a thermocoax wire running throughout its interior. The flow of oxygen was increased by slowly augmenting the pressure of oxygen (up to ~1 mbar at the capillary input) and gradually heating the capillary (up to ~80K at the capillary output). The junction was monitored during the insertion process by continuously recording conductance traces. Once an indication for a change in the conductance traces was observed (see the inset of FIGS. 1B and 1C), the oxygen flow and the capillary heating were stopped.

Conductance traces $P_2$ recorded following the introduction of oxygen show a distinct behavior (FIG. 1B, inset). The density plots consist of 10,000 Ni and 10,000 NiO traces that are aligned from the first value below 4 $e^2/h$ (traces are shifted in the displacement axis for clarity). In contrast to the bare Ni atomic contact, conductance values lower than 2 $e^2/h$ are frequently observed, as the junction is elongated (FIG. 1D). The inventors have found that the oxidized junction can be pulled apart by a larger displacement that can reach up to 8 Å, equivalent to several times the interatomic distance of bulk Ni (2.49 Å). This observation and the presence of several peaks in the length histogram (FIG. 4C) that point to a repeated unit of elongation with atomic length are indicative of the formation of a NiO atomic junction.

When molecular oxygen reaches the bare Ni electrodes, it is dissociated and chemisorbed on the surface, an effect known to occur even at cryogenic temperatures. The appearance of new conductance values below the typical conductance of bare Ni atomic contacts indicates that oxygen is driven into the atomic junction (e.g., FIGS. 1A, 1B). While the bare Ni contact does not withstand elongation, the incorporation of oxygen reinforces the junction, allowing the formation of atomic chains with further elongation. The effect of elongation of atomic chains was previously reported for different metal-oxides, The measurements were repeated for 3 different samples. FIGS. 2A-2F present a comparison between the statistical analyses of conductance traces (conductance vs. length density plots) performed for the three samples, before and after insertion of oxygen: sample I (FIGS. 2A, 2D), sample II (FIGS. 2B, 2E) and sample III (FIGS. 2C, 2F). The traces were aligned from the first value that drops below 4 $e^2/h$. The density plots were constructed from 10,000 traces for the plots of sample I and from 5,000 traces for samples II and III. For all three samples, the following was observed: a high number of counts at 2-4 $e^2/h$ for Ni, and the absence of significant number of counts below (except for tunneling contributions) these values; the appearance of frequent counts at lower conductance values after the insertion of oxygen; and the dramatic increase in junction elongation following the admittance of oxygen. This similarity indicates the reproducible formation of NiO junctions.

The inventors have shown that the conductance characteristics of bare Ni contacts are often observed even in the presence of oxygen, before the formation of the NiO junction, and after the broken electrodes are brought to contact. These observations indicate that both electrodes maintain their Ni character while the oxygen atoms coverage is minor in the vicinity of the contact. The formation of oxygen multi-layers or oxygen-induced changes of the macro-scale properties of the electrode apexes can be ruled out.

Example 2

Comparison Between Conductance During Junction Pull and Push Back

The clear effect of oxygen on the conduction characteristics of the junction is well observed when the junction is pulled apart. The inventors have found that, when the broken tips are brought back to contact, the transport characteristics do not show a similar indication for the presence of oxygen. FIGS. 3A to 3C exemplify trace recorded on a NiO junction when the junction is elongated and when the broken tips are brought back to contact (FIG. 3A), and conductance histograms for NiO (FIG. 3B) and bare Ni (FIG. 3C). The trace recorded after the insertion of oxygen, as shown in FIG. 3A, has two parts: the pull trace ($T_1$), measured during the elongation of the junction, and the push trace ($T_2$), obtained as the tips are pushed towards each other. Conductance histograms illustrate the distribution of conductance value for 10,000 pull traces and 10,000 push traces for NiO and bare Ni.

It can be seen that the pull trace is elongated for a larger displacement and reaches lower conductance values, as compared to the push trace. For the push trace, the conductance that is measured immediately after the contact is restored (4 $e^2/h$) resembles that of an impurity-free single atom Ni contact. This behavior is found to be robust for different traces, as can be seen in FIG. 3B that presents the NiO conductance histograms constructed from the conductance values recorded for the pull and push traces $T_1$ and $T_2$. The pull histogram $T_1$ shows frequent appearance of conductance values below 2 $e^2/h$, indicating the formation of NiO atomic junctions. In contrast, the histogram for push traces $T_2$ is rather similar to the conductance histograms of bare Ni contacts (FIG. 3C), which exhibit a peak at ~3 $e^2/h$ and a low number of counts below 2 $e^2h$, except for the low-conductance tail, attributed to vacuum tunneling between the broken contact apexes.

It is thus evident that oxygen is inserted into the junction during the pull process, but when the broken tips are brought to contact, a Ni—Ni atomic contact has a high probability to be formed. The differences between the NiO pull and push traces are explained by surface deformation during the pulling process, promoting the mobility and eventually the insertion of oxygen in between the electrode tips, whereas the sudden contact reformation when the tips are brought together does not involve substantial surface deformation.

As described above, the final trace segments recorded for bare Ni are characterized by conductance values around 2-4 $e^2/h$, assigned to a single-atom contact. The formation of NiO junctions is indicated by the appearance of new conductance values. Yet, more information can be gained by closely inspecting the 2D conductance vs. length density plots for Ni and NiO (FIGS. 2A-2F). Bare Ni contacts are found to break after an elongation of approximately 1 Å, followed by low conductance reads assigned to tunneling between the broken tips. Tunneling contributions are also found after the insertion of oxygen (FIGS. 2D-2F). These contributions occur at similar displacements as the tunneling contributions observed in clean Ni contacts and are preceded by conductance values typical to a single-atom Ni contact. Hence, the junction has a certain probability to rupture from a single-atom Ni contact configuration, without the formation of a NiO junction.

To estimate the probability of forming a NiO junction, the inventors have studied the percentage of traces that show a conductance signature which is not typical for bare Ni contacts. As indicated above, traces recorded for bare Ni do not show conductance values below ~2 $e^2/h$, excluding vacuum tunneling contributions.

Example 3

Conductance at Junction Break

Figures 4A, 4B, 4C:
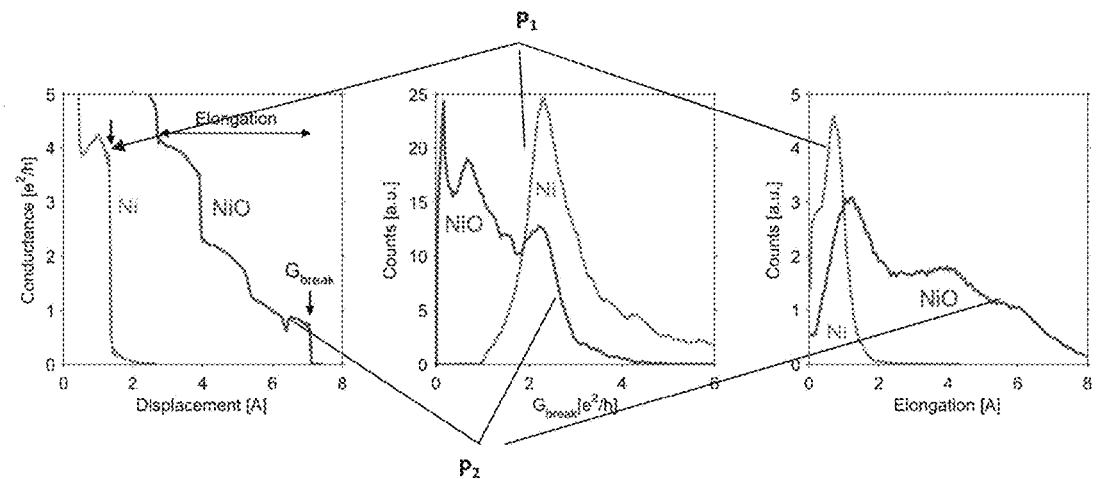
FIGS. 4A-4C illustrate pull traces for Ni and NiO (FIG. 4A), distribution of the last conductance value measured prior to contact rupture $G_{break}$ for bare Ni and NiO junctions (FIG. 4B), and distribution of the elongations from 4 $e^2/h$ until rupture for bare Ni and NiO junctions (FIG. 4C)

Reference is made to FIGS. 4A-4C, showing pull traces for Ni (curve $P_1$) and NiO (curve $P_2$), where arrows mark the rupture of the contact (Fig, 4A); distribution of the last conductance value measured prior to contact rupture $G_{break}$ for bare Ni and NiO junctions (FIG. 4B); and distribution of the elongations from (4 $e^2$)/h until rupture for bare Ni and NiO junctions (FIG. 4C). To obtain the contact rupture $G_{break}$, the inventors utilized an advantage of the appearance of a discontinuity in the conductance prior to rupture (i.e. FIG. 4A). For each trace, contact rupture $G_{break}$ was set as the conductance value appearing before the last discontinuity with a conductance difference larger than 0.1 $e^2/h$. Using this approach, a reliable procedure can be defined for the detection of $G_{break}$ that is not confounded by tunneling contributions. FIG. 4B shows a comparison between the distributions of $G_{break}$ calculated for bare Ni ($P_1$) and NiO ($P_2$) junctions. For the majority of traces (70%) measured after the introduction of oxygen, $G_{break}$ is lower than 1.8 $e^2/h$, indicating a high probability for the formation of NiO junctions. Therefore, the criterion to identify the formation of a NiO junction may be that the conductance value before rupture $G_{break}$ is smaller than 1.8 $e^2/h$.

The appearance of a peak at $G_{break}$=2.5 $e^2/h$, for NiO, which corresponds to the most probable value for bare Ni, indicates that a significant percent of the contacts break from the configuration of a single-atom Ni contact. Hence, the Ni character of the electrodes is maintained to a large extent after the insertion of oxygen. The modification of the transport characteristics and appearance of lower conductance values are therefore clearly caused by the change of the atomic composition within the junction constriction.

FIG. 4C shows the distributions of junction elongations starting from a conductance of 4 $e^2/h$ until rupture before (curve $P_1$) and after (curve $P_2$) the insertion of oxygen. As can be seen, Ni atomic contacts mostly break after a short elongation of 1-2 Å. For NiO, the length histogram shows a sequence of wide peaks. The first peak, centered at 1.2 Å, is attributed to junctions that break from a single atom Ni contact configuration. The inter-peak displacements are approximately 2.7±0.5 Å (first and second peaks) and 2.1±0.5 Å (second and third peaks). These distances are comparable to the calculated bond lengths for low coordination Ni—O (1.8 Å) and Ni—Ni (2.24 Å) bonds (9, 10).

The appearance of the peak structure and the long overall elongations are known to be a signature for the formation of atomic chains.

Example 4

Shot Noise Measurements

In order to detect spin-dependent transport, the inventors investigated the electronic shot noise generated by the above described junctions. The study of shot noise has shown to be useful for exposing underlying transport mechanisms for various systems.

Figure 5:
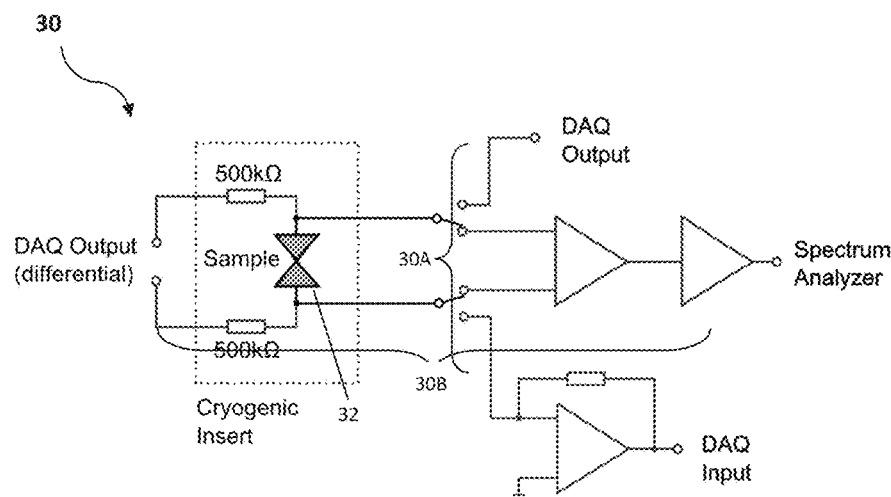
FIG. 5 exemplifies a scheme of an electronic circuit used for conductance and shot noise measurements.

In this connection, reference is made to FIG. 5, exemplifying a scheme of an electronic circuit 30 for conductance and shot noise measurements. The electronic circuit 30 is configured for operating in two switchable measurement modes: Conductance Mode (circuit 30A) and Noise Mode (circuit 30B). The electronic setup 30 is connected to a sample 32. The Conductance Mode is used to measure the conductance of the sample and the dI/dV spectra, and the Noise Mode is applied to measure the shot noise generated by the junction. In the Noise Mode of measurement, the relatively noisy instruments used in the Conductance Mode are disconnected from the sample due to the high sensitivity of the shot noise measurements. The voltage noise is amplified by a differential low-noise amplifier followed by a voltage amplifier. A power spectrum between 0-100 kHz is then measured and averaged 5000 times by a fast dynamic signal analyzer. To measure shot noise, the sample is current biased by a DAQ card connected to the sample through two 500 kΩ resistors located in proximity to the sample. The total cabling length was minimized to reduce stray capacitance to ~100 pF and an additional halving of the capacitance was achieved by the differential connection. The low level of the measured noise signal makes it sensitive to extrinsic noise. To impede noise pickup, the measurement setup was located within a Faraday cage and all instruments were connected to a specially assigned quiet ground. The amplifiers are powered by batteries to avoid noise injection from the power lines. Additionally, an RC filter was connected after the piezo driver to minimize possible excitation of mechanical noise coupled to the junction through the piezoelectric element. The RC filter was bypassed when recording conductance traces in order to avoid interference with the measurements.

Figure 6:
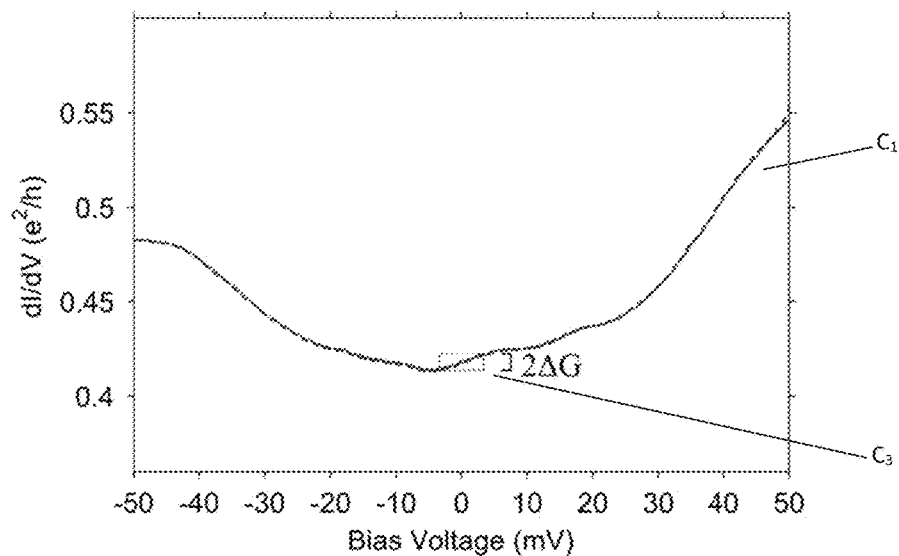
FIG. 6 show the differential conductance (dI/dV) measured as a function of bias voltage before and after conducting shot noise measurements.

Reference is made to FIG. 6 showing the differential conductance (dI/dV) measured as a function of bias voltage before (solid curve $C_1$) and after (dashed curve $C_2$) conducting shot noise measurements. Marked area $C_3$ shows the voltage window from which the zero-bias conductance (G) and error (ΔG) were calculated, corresponding to the voltage window of the shot noise measurements.

Thus, the electronic circuit 30 first operated in the Conductance Mode (circuit 30A) and measured data was obtained, solid curve $C_1$, and then the circuit was switched to Noise Mode and the voltage noise of the sample was measured as a function of applied bias current (FIGS. 7A-7D), and finally, the differential conductance spectrum (dashed curve C2) was measured again by switching back to Conductance Mode (circuit 30A) to ensure that the contact configuration remained stable.

The value of zero-bias conductance G was set to the average differential conductance within the bias voltage window used for shot noise measurements (~4 mV). The small voltage window was chosen to avoid conductance variations that could be caused by the onset of phonons. The error ΔG was determined as half the difference between the maximum and minimum differential conductance obtained within the specified bias range as shown in FIG. 6. Only measurements with ΔG<0.04 $e^2/h$ were considered for the rest of the analysis in order to ensure that the condition of unvarying transmission probabilities is met.

Figure 7A:
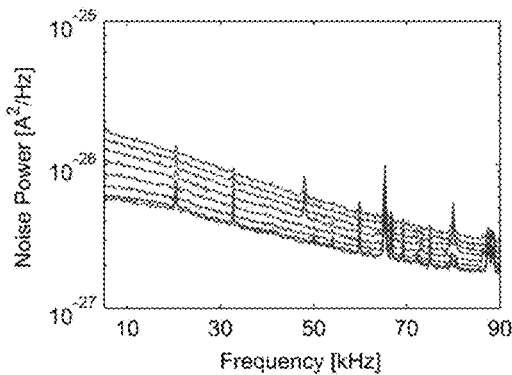
FIGS. 7A-7D exemplify the conductance and shot noise measurements, where
Figure 7B:
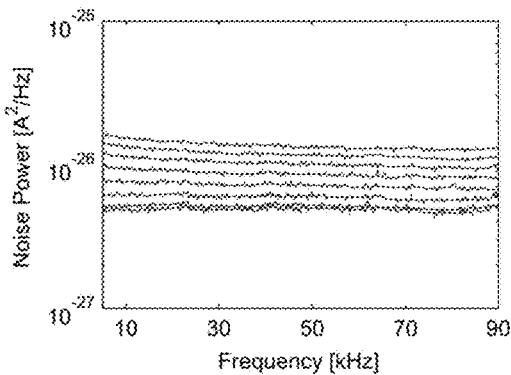

FIGS. 7A-7B show an example of noise measurements performed on a nickel-oxygen junction (0.41 $e^2/h$) at different bias voltages (FIG. 7A), corrected spectra after applying a peak-filter filter and correcting for a fitted RC transfer function and the measured voltage noise (FIGS. 7B), dependence of noise on bias voltage (FIG. 7C), where the noise was averaged in a frequency window between 40-60 kEHz, and noise dependence in reduced parameters (FIGS. 7D), A series of averaged voltage noise spectra were measured as a function of applied bias current (FIG. 7A). A peak-filter was applied on the data to remove spurious peaks originating from external noise sources. The voltage noise of the amplifier (1.5 nV/√Hz) was measured separately as function of frequency and subtracted from the signal. In order to address the low-pass filter behavior caused by the stray capacitance, the recorded signal at zero bias is fitted to a RC transfer function and an inverse function was applied to correct the data. The corrected spectra are frequency independent within the measurement range (FIG. 7B). The current noise $S_I$ is averaged over a selected frequency window that is free of spikes from external sources. The error $\Delta S_I$ is calculated from the standard deviation of the noise.

Figure 7C:
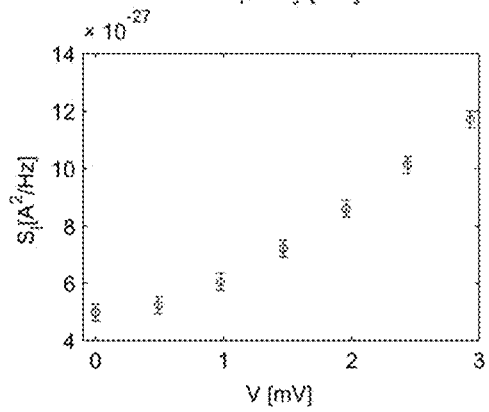

FIG. 7C shows the dependence of the current noise $S_1$ on the bias voltage applied across the sample. The current noise of a ballistic conductor with constant transmission probabilities vs. energy follows the expression:

$$S_I(V) = 4k_B T \frac{e^2}{h} \sum_{n=1}^{N} \sum_{\sigma=\uparrow\downarrow} \tau_{n,\sigma}^2 + 2eV \coth\left(\frac{eV}{2k_B T}\right) GF \quad (2)$$

where $\tau_{n\sigma}$ are the spin-dependent transmissions probabilities of N conduction channels with $\sigma \in \{\uparrow\downarrow\}$, $k_B$, T, e, h, V are the Boltzmann constant, temperature, electron charge, Plank constant and applied bias voltage, respectively.

Equation (2) can be linearized by introducing the reduced parameters X and Y, such that:

$$Y(V) = \frac{S_I(V) - S_I(0)}{S_I(0)}$$

$$X(V) = \frac{eV}{2k_B T} \coth\left(\frac{eV}{2k_B T}\right)$$

The resulting expression yields:

$$Y(V) = [X(V) - 1]F \quad (3)$$

Figure 7D:
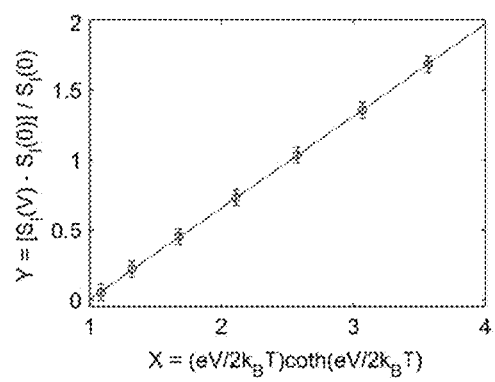
Figure 12:
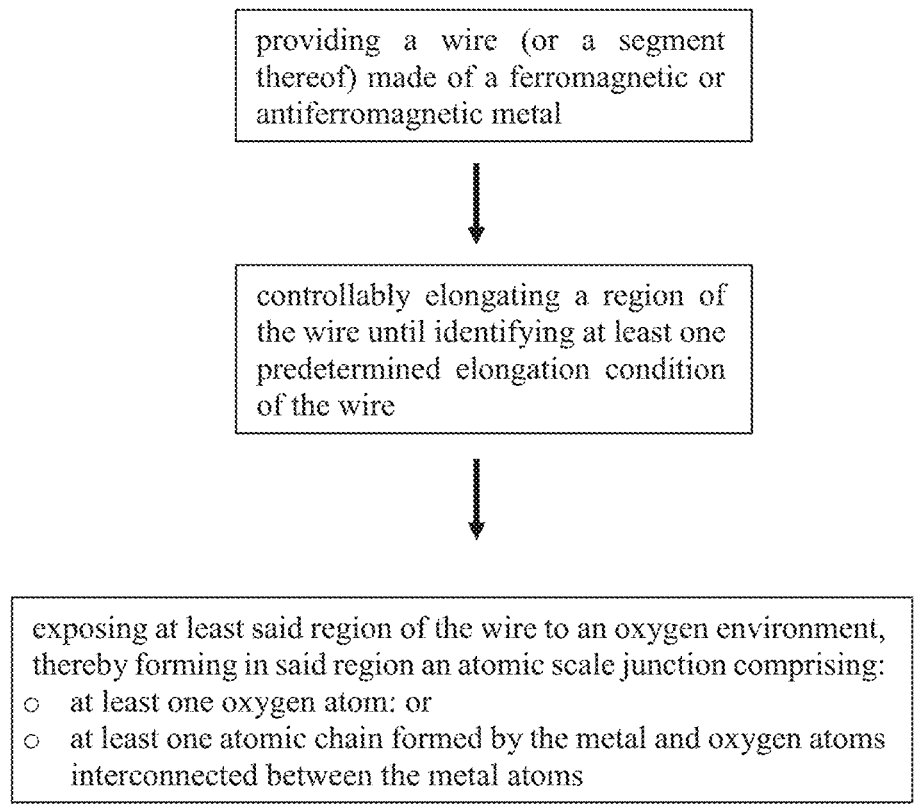
FIGS. 12 and 13A-13C illustrate embodiments of methods of fabrication of a spin filter device.
Figures 13A, 13B, 13C:
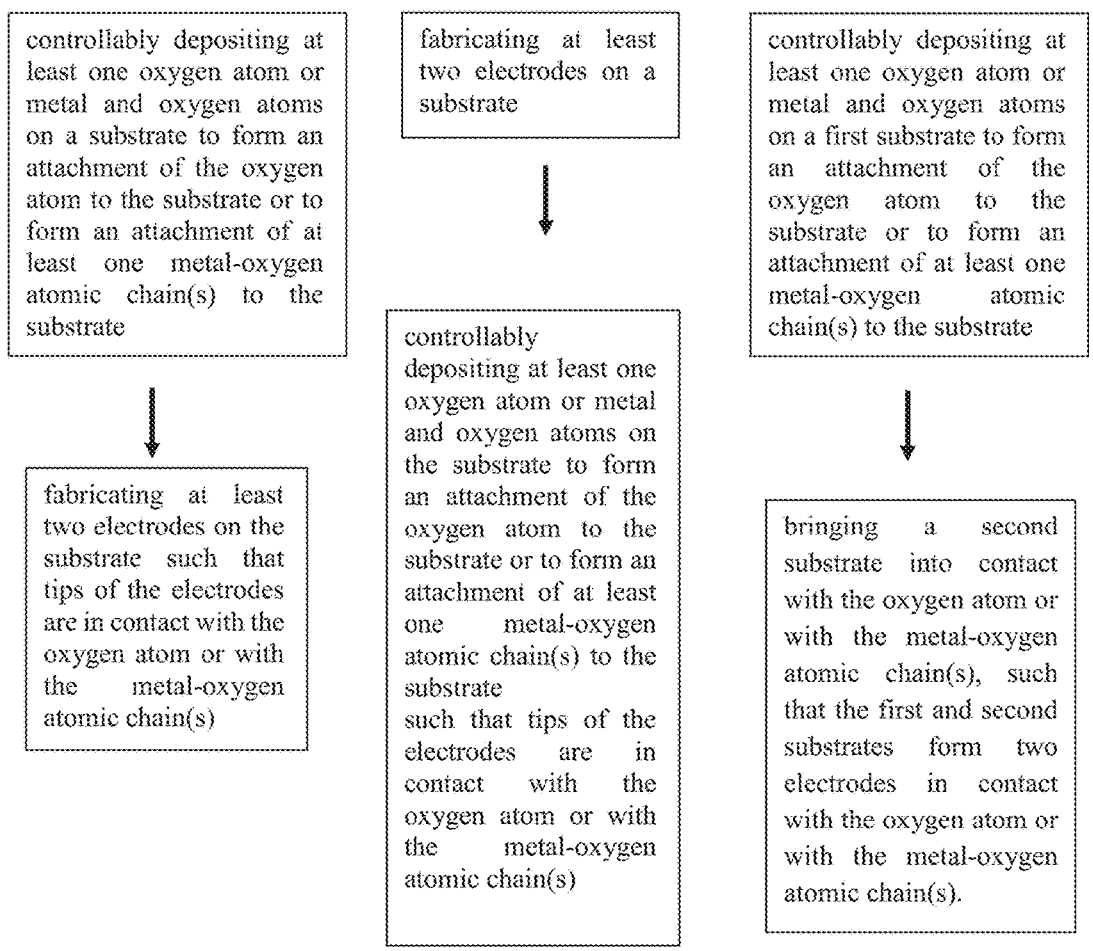

FIG. 7D shows the linear dependence of the data when presented in the reduced parameters. As will be described below, the Fano factor F and its error ΔF can now be obtained from a linear fit to eq. (3).

Example 5

Analysis of Shot Noise Measurements

The following is the description of an analysis procedure carried out by inventors for obtaining a quantitative estimation of the spin polarization from conductance and shot noise measurements.

Information regarding the conductance spin polarization can be determined from the experimentally obtained conductance G and Fano factor F. Within the Landauer formalism, the overall conductance can be decomposed to contributions from the eigenmodes of the scattering matrix, also known as conduction channels. For the general case, there are 2 N channels, each channel having a transmission probability of $0 \geq \tau_{n o \Sigma} = 1$, where $1 \geq n \geq N$ is the channel number and $\tau \in \{\uparrow \downarrow\}$ is the spin type. The conductance equals to the sum of the transmission probabilities, multiplied by the conductance quantum $G_0 = e^2/h$, $$G = G_0 \Sigma_{n\sigma} \tau_{n\sigma} \tag{4}$$

In atomic scale junctions, transport is allowed through the local states crossing the Fermi energy. This leads to a limitation on the number of channels contributing to the transport, which cannot exceed the number of atomic valence orbitals. For example, it was found that for single atom contacts made of the s-metal Au, two degenerate spin-channels with identical transmission contribute to the conductance (one valence orbital, and twofold factor for spin), which thus has a conductance of nearly 2 $e^2/h$. For an sd-metal such as Ni, up to twelve channels (six available orbitals, and a twofold factor for spin) can potentially contribute to the transport, however this number is strongly decreased as not all orbitals are in the relevant energetic window or efficiently spatially delocalized along the junction.

Measurement of the Fano factor can provide useful information regarding the distribution of channels. The Fano factor follows:

$$F = \frac{\sum_{n\sigma} \tau_{n\sigma}(1 - \tau_{n\sigma})}{\sum_{n\sigma} \tau_{n\sigma}} \tag{5}$$

Similar to the conductance, the Fano factor depends solely on $\tau_{n\sigma}$, and therefore obtaining the combination of Fano factor F and conductance G experimentally provides a useful tool to gain information regarding $\tau_{n\sigma}$. It should be noted that both Fano factor F and conductance G are not sensitive to the sign of spin $\sigma$. Therefore it is not possible to distinguish between the two spin types. For instance, two channels with the same spin $\tau_\uparrow$, $\tau_\uparrow$ will yield the same values for Fano factor F and conductance G as two channels with inversed spins $\tau_\eta$, $\tau_\eta$ or with opposite spins $\tau_\uparrow$, $\tau_\eta$. However, it is possible to obtain a lower bound for the spin polarization due to a limitation on the distribution of $\tau_{n\sigma}$ that can result in a certain combination of both F and G.

For example, in case of a single channel with a transmission probability of 1, the measured values will be F=0 and G=1 $e^2/h$. Any other channel distribution that sums to $e^2/h$ results in a positive nominator for F and yields F>0.

Therefore, by measuring this specific combination of F and G, the channel distribution can be fully known, except for the spin type, that is, only a single channel contributes to the conductance and it is either $\tau_\uparrow = 1$ or $\tau_\eta = 1$. This information is sufficient to deduct that the current is fully spin-polarized in this case.

The absolute spin polarization is defined as $$SP = |G_\uparrow - G_\eta|/G, \tag{6}$$

where $$G_\sigma G_0 \Sigma_n \tau_{n,\sigma}. \tag{7}$$

is the conductance for each spin type.

Spin polarization SP can take values between 0 to 100%. For the case in which transport takes place through two channels of opposite spin types, the spin-polarization can be obtained analytically, and the relation with Fano factor F and conductance G can be expressed as:

$$F = 1 - \frac{1 + SP^2}{2} \frac{G}{G_0} \tag{8}$$

Here, $F = \Sigma \tau_{n,\sigma}(1 - \tau_{n,\sigma})/\Sigma \tau_{n,\sigma}$ is the Fano factor, which is equal to the shot noise in units of 2eI (I is the current).

The inventors have shown that this relation (8) is very useful since the spin polarization SP value obtained using it, provides a minimal bound for the actual spin polarization of the contact. The inventors have shown that spin polarization given by any distribution of $\tau_{n,\sigma}$ is necessarily equal or higher than the spin polarization SP extracted from eq. (8) for the corresponding combination of Fano factor F and conductance G.

In this connection, reference is made to FIGS. 8A-8C where FIG. 8A shows Fano factor vs. conductance F(G) dependence obtained for different values of spin polarization SP for the case of two channels with opposite spins; FIG. 8B shows minimal spin polarization SP obtained numerically for up to four channels for different combinations of F and G; and FIG. 8C shows the resulting effect of additional two degenerate channels with the transmissions $\tau_\uparrow = \tau_\eta = 0.05$. Here, minimal spin polarization $SP_{min}$ was calculated for four channels as in FIG. 8B, but F and G were shifted as a result of the additional channel.

More specifically, FIG. 8A shows the F(G) relation for different values of spin polarization SP ranging from 0 to 100% calculated from eq. (8). Lines K provide a lower boundary for spin polarization, namely points below a certain line indicate spin current polarization equal or higher than specified near the line. The monotonically decreasing dependence of F(SP) in eq. (8) implies that any combination of F and G that lies below one of these lines indicates that the spin polarization is higher than the SP value indicated on the line.

The inventors performed a numerical test for the minimum spin polarization $SP_{min}$ estimation. All possible distributions of four spin channels with transmission probabilities $0 \leq \tau_i \leq 1$ were enumerated with a precision of $\Delta \tau_i = 0.0025$ and up to the total transmission of $\Sigma \tau_i \leq 2$. For each set of transmissions $\{\tau_i\}_{i=}^4$, minimum spin polarization $SP_{min}$ was calculated after checking all the possible arrangements of $\tau_i$ into two spin groups that yield $G_\uparrow$ and $G_\eta$. The results are shown in FIG. 8B in the form of a 2D map of minimum spin polarization $SP_{min}$ as function of F and G. As can be seen, the numerically calculated value of $SP_{min}$ is in perfect agreement with the minimum spin polarization obtained analytically for two channels (FIG. 8A).

In order to illustrate how the contribution of additional channels can affect this analysis, the inventors considered two identical spin channels with equal transmissions of $\tau_\uparrow = \tau_\eta = 0.05$. Such contribution could result from vacuum tunneling between Ni atoms in the vicinity of the NiO atomic junction. To simulate this scenario, the numerical simulation was modified to add the transmissions of the additional channel to the calculation of F and G. FIG. 8C shows the results of the simulation. As shows, the additional channels lead to a significant increase of the Fano factor, impairing the possibility to detect spin polarized transport.

Hence, a part of the measured NiO junctions have considerably larger spin polarization SP than the lower bound assigned using eq. (8).

Thus, the spin polarization SP can be uniquely determined from the measured values of Fano factor F and conductance G. For the general case of a variable number of spin channels, it can be shown that the spin polarization is necessarily equal or higher than the SP obtained using Eq. 8. Taking advantage of that in the general case of a variable number of spin channels the spin polarization is necessarily equal or higher than the SP obtained using Eq. (8), a lower bound for the spin polarization in NiO junctions can be drawn.

Reference is made to FIGS. 9A-9C illustrating lifting of spin-degeneracy in elongated NiO junctions. Here, FIG. 9A shows evolution of the Fano factor (F) and conductance (G) recorded for 3 elongation sequences (the total elongation is indicated for each sequence); FIG. 9B shows bias dependence of the excess noise $S(V)-S(V=0)$ for an elongated NiO junction ($G=0.49\pm0.01$, $F=0.53\pm0.02$); and FIG. 9C shows dI/dV curve measured for the junction shown in FIG. 9B. In FIG. 9B, curve $N_1$ shows the calculated noise for a single spin channel ($\tau=0.49$), dashed curves $N_2$ and $N_3$ show the calculated noise for two channels with respectively SP=0 and SP=0.9.

The above-described approach is visualized in the FG space (FIG. 9A) as follows. Two important regions can be identified: the inaccessible region $R_1$ in which no solutions for (F,G) exist, and the restricted region $R_2$, where necessarily SP>0. Following Eq. 8, measured values located below one of the solid lines in the restricted region indicate a spin polarization SP which is greater than the value indicated on the line.

The inventors performed sequences of conductance and noise measurements throughout the elongation of NiO junctions (FIG. 9A). Following each elongation step, the value of F was determined from the noise dependence on bias voltage. FIG. 9A shows the evolution of F and G for 3 different elongation sequences. As the junctions are elongated, the data points penetrate the restricted region $R_2$, indicating that the current is spin-polarized, i.e. increasing degree of spin polarization (lines K). The appearance of points in the restricted region is in contrast to measurements on non-magnetic atomic contacts, where the data points accumulated at the outer boundary of the restricted region. After elongation of about 1-2 Å, the conductance is found to be highly spin-polarized, with SP values reaching 95-100%. The values of F and G are rather insensitive to further elongation, indicating that the high spin polarization is preserved by the formation of a stable atomic structure.

FIG. 9B shows the bias dependence of the noise measured for an elongated junction. The data agrees very well with the expected shot noise for a single spin channel (SP=100%; curve $N_1$) using no fitting parameters. Lower values of spin polarization SP result in a higher Fano factor, leading to a distinguishable noise dependence on bias. This is demonstrated for the case of two channels assuming either SP=90% (curve $N_3$) or SP=0% (curve $N_2$). The zero-bias conductance used here is obtained from the dI/dV spectrum in the bias window of 4 mV (FIG. 9C). The measured conductance and shot noise provide clear evidence that elongated NiO junctions are highly efficient spin-filters.

Example 6

Distribution of the Fano Factor F and conductance G for an ensemble of Ni and NiO Atomic Junctions The origin of the unique spin-transport properties of NiO junctions can be understood in view of selective orbital hybridization between low-coordinated Ni and O atoms. Reference is made to FIGS. 10A and 10B illustrating channel blocking via local orbital manipulation, where FIG. 10A is a schematic illustration of the density of states (DOS) for Ni and NiO junctions, and FIG. 10B shows a statistical distribution of the Fano factor F and conductance G for an ensemble of Ni and NiO atomic junctions. The experimental errors for F and G do not exceed 0.04 and $0.025G_0$, respectively.

More specifically, FIG. 10A schematically illustrates the local density of states for Ni and NiO systems, based on known calculations for infinite 1D atomic chains and atomic junction geometries. For Ni, the 3d and 4s atomic orbitals have states near the Fermi energy that can contribute several channels to the conductance. The conductance is governed by the polarized s bands leading to only moderate spin-polarization, consistent with reported experimental values that did not exceed 45%. In contrast, for NiO the hybridization scheme and the associated charge transfer between nickel and oxygen lead to a distinct energetic picture. Only contributions from two (degenerate) minority-spin orbitals cross the Fermi energy, formed by hybridization of two oxygen $2p_\perp$ orbitals ($p_x$, $p_y$, where z is the junction axis) and two nickel $3d_\perp$ orbitals ($d_{xz}$, $d_{yz}$), while no majority states are available at the Fermi level. Thus, NiO atomic junctions have a local half-metallic electronic structure, with up to two minority-spin channels available for transport.

To test the general behavior of Ni and NiO junctions in view of the above theoretical description, the inventors have measured the distribution of F and G for a large ensemble of bare Ni (FIG. 10B, squares) and NiO (circles) junctions. The results for bare Ni contacts are first considered. Line L indicate the maximum value of Fano factor F that can be obtained by a certain number of channels N. Accordingly, the distribution of data points indicates that in most cases a minimum of 4-6 channels contribute to the conductance through a single Ni atom contact, in good agreement with transport calculations. For NiO, the F and G distribution obtained at $G=2-4$ $e^2/h$ coincides with the values measured for bare Ni contacts, indicating that the formation of the NiO junction begins from a single atom Ni contact, for which the measured transport properties are not noticeably affected by the presence of oxygen absorbed on the surface. At low conductance values ($G<1$ $e^2$/h), associated with the formation of the NiO junction, most of the measurements are located in the restricted region, indicating a consistent tendency to feature highly spin-polarized transport.

Further insight into the emergence of half-metallicity can be gained by studying the evolution of spin channels during the formation of the NiO junction. To obtain the channel resolution, the inventors used a recently introduced numerical analysis of conductance and shot noise data. Reference is made to FIGS. 11A and 11B showing two examples for the conductance contribution of the four most conducting channels as a function of inter-electrode displacement. More specifically, the figures show channel-resolved conductance evolution during the formation of NiO junctions. In the figures, the overall conductance (curve $G_{total}$) and the separate contributions for the spin channels (color-shaded error bars) as a function of inter-electrode displacement are shown for two elongation sequences. The four most conducting channels are presented out of six calculated channels. At $G>1.6$ $e^2$/h, at least four channels are found to significantly contribute to the conductance. Following an elongation of ~2 Å the number of channels decreases until the conductance is dominated by a single spin channel. The observed channel-filtering is in good agreement with the calculations known from the literature for a single oxygen atom bridge located between two nickel apexes. The distance in which the channel evolution takes place is in reasonable agreement with the difference between the calculated Ni atomic separation for Ni—Ni (2.24 Å) and Ni—O—Ni (3.6 Å) configurations.

It should be noted that while the calculations have found up to two energetically degenerate minority-spin channels for highly symmetric model structures, a removal of the degeneracy due to less symmetric junction configurations in experiment leads to a single spin channel as was observed. These results show that a minor change in the local atomic structure, that is, the incorporation of oxygen between the Ni apexes, can dramatically alter spin transport properties.

Thus, the inventors provide a novel approach for configuring a spin filter structure operable as a spin polarized conductor or spin valve, in which ideal spin polarization can be reached at a single atom level, which is the ultimate limit for electronic miniaturization. The inventors have shown that the enhanced spin-filtering effect results from the chemical modification of the local electronic structure at the junction. The high spin polarization together with the very large spin-current density ($\sim 10^{11} Acm^{-2}$) makes such junctions attractive candidates for realization of atomic-scale spintronic applications, including significant spin-torque transfer and very high magnetoresistance effects.

As described above, the spin polarized conductor device of the invention includes at least one chain formed by one oxygen atom in between two metal atoms, in which, due to selective orbital hybridization, the spin-polarized currents via the frontier d orbitals of the metal are promoted while the poorly spin polarized-currents via the frontier s orbitals of the metal are suppressed, where metal is a nanoscale low-coordinated structure based on ferromagnetic metal (e.g. nickel, cobalt, iron) or antiferromagnetic metal (e.g. transition metal compounds, especially oxides) that chemically reacts with oxygen.

As also exemplified above, the spin polarizer device (e.g. filter, conductor, valve) of the invention can be fabricated by using a metal wire which is eventually broken into two segments that act as two electrodes with low coordinated apexes (tips); stretching the nickel wire until certain condition(s) is/are satisfied, such as resistance, and/or a predetermined time interval and/or a predetermined wire length; and exposing the tips' region to oxygen environment, either upon arriving to the desired tips by stretching or during the stretching. It should be understood that this fabrication method is just an example of the formation of the nickel-oxygen-nickel junction and suspended nickel-oxygen atomic chains. This approach has the advantage of straight forward, in-situ analysis of the electronic transport properties of the junction. However, nickel-oxygen chains (. . . Ni—O—Ni—O . . . ) can also be formed spontaneously by oxidation of nickel surfaces and these chains can be fabricated by the evaporation of nickel and oxygen on insulating surfaces.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A spin filter device comprising two metal electrodes ended with low-coordinated surfaces and at least one atomic scale junction between said surfaces, said atomic scale junction comprising:

at least one oxygen atom; or at least one atomic chain formed by atoms of said metal and oxygen atoms interconnected between said metal atoms;

thereby enhancing a spin-filtering effect by selective p-d orbital hybridization between the p orbitals of the oxygen and the d orbitals of the metal, promoting spin-polarized currents via frontier d orbitals of the metal and suppressing poorly spin polarized-currents via frontier s orbitals of the metal, wherein said atomic scale junction exhibits conductance value lower than 1.8 $e^2/h$.

2. The device of claim 1, wherein said electrodes are made of a nanoscale low-coordinated structure comprising ferromagnetic or antiferromagnetic metal that chemically reacts with oxygen.

3. The device of claim 1, wherein a length of said atomic chain in said atomic scale junction is selected such that the device is operable as a spin filter.

4. The device of claim 1, wherein a length of said atomic chain in the atomic scale junction is selected such that the device is operable as a spin current conductor.

5. The device of claim 1, wherein the metal electrodes comprises at least one of the following materials: nickel, cobalt, iron, alloys thereof.

6. The device of claim 1, wherein the current flowing through said device is at least 50% spin polarized or at least 75% spin polarized or at least 90% spin polarized.

7. The device of claim 1, wherein said device is operated at room temperature.

8. The device of claim 1 wherein said device is used as a reading probe/head of magnetic information, a memory element, a conductor for spin polarized current, or a spin current polarizer/filter or a combination thereof.

9. A method of fabrication of a spin filter device, the method comprising:

providing a wire (or a segment thereof) made of a ferromagnetic or antiferromagnetic metal;

controllably elongating a region of said wire until identifying at least one predetermined elongation condition of the wire;

exposing at least said region of the wire to an oxygen environment, thereby forming in said region an atomic scale junction comprising:

at least one oxygen atom: or at least one atomic chain formed by the metal and oxygen atoms interconnected between the metal atoms;

resulting in a selective p-d orbital hybridization between the p orbitals of the oxygen and the d orbitals of the metal, wherein said atomic scale junction exhibits conductance value lower than 1.8 $e^2/h$.

10. The method of claim 9, wherein said controllably elongating the region of the wire comprises monitoring at least one parameter of the wire.

11. The method of claim 9, wherein said controllably elongating the region of the wire comprises monitoring a duration of the elongation process.

12. The method of claim 10, wherein at least one parameter of the wire being monitored comprises at least one of the following: a characteristic resistance of a single metal atom, conductance value, length of said region.

13. The method of claim 9, wherein said controllable elongation of the region of the wire and said exposing of the at least said region of the wire to the oxygen environment are performed substantially simultaneously.

14. The method of claim 9, wherein said wire is made of at least one of the following materials: nickel, cobalt, iron, alloys thereof.

15. The method of claim 9, wherein said controllable elongation of the region of the wire and said exposing of the at least said region of the wire to the oxygen environment comprise controlling a length of the atomic chain being formed.

16. The method of claim 9, wherein said exposing of the at least elongated region of the wire to the oxygen environment comprises allowing at least partial oxidation of the wire surface to thereby form metal-oxygen atomic chains attached to the surface.

17. The method of claim 9, wherein said exposing of the at least elongated region of the wire to the oxygen environment comprises deposition of oxygen onto said at least elongated region of the wire.

18. The method of claim 9, wherein said metal comprises at least one of the following materials: nickel, cobalt, iron, alloys thereof.

19. A method of fabrication of a spin filter device comprising:
two metal electrodes ended with low-coordinated surfaces and at least one atomic scale junction between said surfaces, said atomic scale junction comprising:
at least one oxygen atom; or
at least one atomic chain formed by atoms of said metal and oxygen atoms interconnected between said metal atoms;
thereby enhancing a spin-filtering effect by selective p-d orbital hybridization between the p orbitals of the oxygen and the d orbitals of the metal, promoting spin-polarized currents via frontier d orbitals of the metal and suppressing poorly spin polarized- currents via frontier s orbitals of the metal;
said method comprising:
controllably depositing said at least one oxygen atom or said metal and oxygen atoms on a first substrate to form an attachment of said oxygen atom to said first substrate or to form an attachment of said at least one metal-oxygen atomic chain(s) to said first substrate; and
fabricating said at least two electrodes on said first substrate such that tips of said electrodes are in contact with said oxygen atom or with said metal-oxygen atomic chain.

20. The method of claim 19, wherein said electrodes are fabricated prior to said deposition of oxygen or of metal and oxygen atoms or wherein said electrodes are fabricated following said deposition of oxygen or of metal and oxygen atoms.

21. The method of claim 19, wherein said first substrate is insulating.

22. The method of claim 19, wherein said electrodes comprise at least one of the following materials: nickel, cobalt, iron, alloys thereof.

23. A method of fabrication of a spin filter device comprising:
two metal electrodes ended with low-coordinated surfaces and at least one atomic scale junction between said surfaces, said atomic scale junction comprising:
at least one oxygen atom; or
at least one atomic chain formed by atoms of said metal and oxygen atoms interconnected between said metal atoms;
thereby enhancing a spin-filtering effect by selective p-d orbital hybridization between the p orbitals of the oxygen and the d orbitals of the metal, promoting spin-polarized currents via frontier d orbitals of the metal and suppressing poorly spin polarized- currents via frontier s orbitals of the metal;
said method comprising:
controllably depositing said at least one oxygen atom or said metal and oxygen atoms on a first substrate to form an attachment of said oxygen atom to said first substrate or to form an attachment of said at least one metal-oxygen atomic chain(s) to said first substrate; wherein following said metal and oxygen deposition, a second substrate is brought into contact with said metal-oxygen atomic chains, such that said first and second substrates form said two electrodes in contact with said metal-oxygen atomic chains.

24. The method of claim 23, wherein said first and said second substrates or portions thereof are conductive.

* * * * *